(12) United States Patent
Chiu

(10) Patent No.: US 11,417,569 B2
(45) Date of Patent: Aug. 16, 2022

(54) PACKAGE STRUCTURE HAVING INTEGRATED CIRCUIT COMPONENT WITH CONDUCTIVE TERMINALS OF DIFFERENT DIMENSIONS

(71) Applicant: Taiwan Semiconductor Manufacturing Co., Ltd., Hsinchu (TW)

(72) Inventor: Ming-Yen Chiu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/706,781

(22) Filed: Sep. 18, 2017

(65) Prior Publication Data

US 2019/0088547 A1 Mar. 21, 2019

(51) Int. Cl.
*H01L 21/78* (2006.01)
*H01L 23/544* (2006.01)
(Continued)

(52) U.S. Cl.
CPC .............. *H01L 21/78* (2013.01); *H01L 21/56* (2013.01); *H01L 21/561* (2013.01);
(Continued)

(58) Field of Classification Search
CPC ... H01L 2224/0603; H01L 2224/06051; H01L 2224/06102; H01L 2224/06505; H01L 2224/06515–06519; H01L 2224/04105; H01L 2224/022–02215; H01L 2224/0391;
H01L 2224/03916; H01L 2224/1148; H01L 2224/1191; H01L 2224/11916; H01L 2224/2748; H01L 2224/2791; H01L 2224/27916; H01L 2224/0903; H01L 2224/09051–0905; H01L 2224/091–0918; H01L 2224/09515–09519; H01L 2224/03–03921; H01L 24/03; H01L 21/76802–76817; H01L 21/76877–76885; H01L 21/76841–76876; H01L 2224/141–14183; H01L 2224/14051;
(Continued)

(56) References Cited

U.S. PATENT DOCUMENTS 8,987,922 B2 3/2015 Yu et al.
9,000,584 B2 4/2015 Lin et al.
(Continued)

*Primary Examiner* — Nelson Garces
(74) *Attorney, Agent, or Firm* — JCIPRNET

(57) ABSTRACT

An integrated circuit component including a semiconductor die, a plurality of conductive vias and a protection layer is provided. The semiconductor die includes an active surface and a plurality of conductive pads disposed on the active surface. The conductive vias are respectively disposed on and in contact with the conductive pads, wherein each conductive via of a first group of the conductive vias has a first maximum size, each conductive via of a second group of the conductive vias has a second maximum size, and the first maximum size is less than the second maximum size in a vertical projection on the active surface. The protection layer covers the active surface and is at least in contact with sidewalls of the conductive vias.

20 Claims, 17 Drawing Sheets

(51) Int. Cl.
  *H01L 23/31* (2006.01)
  *H01L 23/58* (2006.01)
  *H01L 21/683* (2006.01)
  *H01L 21/56* (2006.01)
  *H01L 23/00* (2006.01)

(52) U.S. Cl.
  CPC ........ *H01L 21/568* (2013.01); *H01L 21/6835* (2013.01); *H01L 23/3128* (2013.01); *H01L 23/3135* (2013.01); *H01L 23/544* (2013.01); *H01L 23/585* (2013.01); *H01L 24/05* (2013.01); *H01L 24/15* (2013.01); *H01L 24/19* (2013.01); *H01L 24/20* (2013.01); *H01L 24/14* (2013.01); *H01L 24/17* (2013.01); *H01L 2221/68345* (2013.01); *H01L 2221/68359* (2013.01); *H01L 2221/68372* (2013.01); *H01L 2223/5442* (2013.01); *H01L 2223/5448* (2013.01); *H01L 2223/54426* (2013.01); *H01L 2224/02331* (2013.01); *H01L 2224/0401* (2013.01); *H01L 2224/04105* (2013.01); *H01L 2224/0603* (2013.01); *H01L 2224/12105* (2013.01); *H01L 2224/13023* (2013.01); *H01L 2224/13024* (2013.01); *H01L 2224/13025* (2013.01); *H01L 2224/1403* (2013.01); *H01L 2224/16265* (2013.01); *H01L 2224/1703* (2013.01); *H01L 2224/214* (2013.01); *H01L 2224/81005* (2013.01); *H01L 2224/94* (2013.01)

(58) Field of Classification Search
  CPC ........................... H01L 2224/15–17519; H01L 2224/1301–13028; H01L 2224/13075–13084; H01L 2224/1601–16014; H01L 2224/161–16268; H01L 2224/165–16507; H01L 2224/1403; H01L 2224/14505; H01L 2224/14515–14519; H01L 2224/1703; H01L 2224/17051–17055; H01L 2224/171–17183; H01L 2224/17505; H01L 2224/17515–17519; H01L 2224/73103–73104; H01L 2224/73153; H01L 2224/73203–73209; H01L 2224/73253–73261; H01L 24/05–17; H01L 2224/13021–13028; H01L 2223/54426; H01L 2224/0401; H01L 2223/5448

See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,905,527 B1* | 2/2018 | Hacker | H01L 25/50 |
| 2011/0079897 A1* | 4/2011 | Park | H01L 23/49816 257/737 |
| 2011/0248398 A1* | 10/2011 | Parvarandeh | H01L 24/06 257/737 |
| 2012/0153462 A1* | 6/2012 | Wakiyama | H01L 23/544 257/737 |
| 2012/0313236 A1* | 12/2012 | Wakiyama | H01L 25/50 257/734 |
| 2014/0131858 A1* | 5/2014 | Pan | H01L 24/13 257/737 |
| 2014/0252646 A1* | 9/2014 | Hung | H01L 21/76843 257/774 |
| 2015/0262950 A1* | 9/2015 | Cate | H01L 21/00 257/737 |
| 2017/0012081 A1* | 1/2017 | Shen | H01L 21/78 |

* cited by examiner

US 11,417,569 B2

PACKAGE STRUCTURE HAVING INTEGRATED CIRCUIT COMPONENT WITH CONDUCTIVE TERMINALS OF DIFFERENT DIMENSIONS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
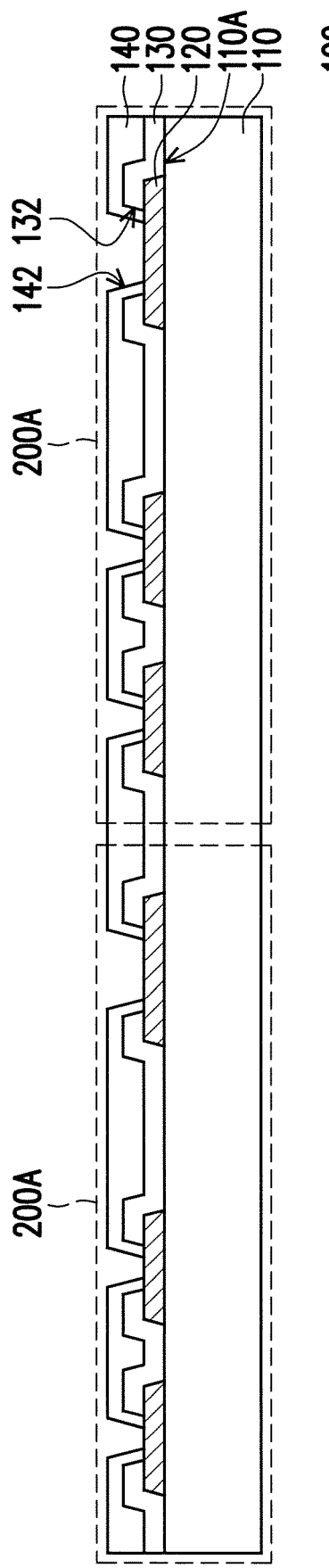
FIG. 1A to FIG. 1J illustrate cross-sectional views of various stages of fabricating a package structure in accordance with some exemplary embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
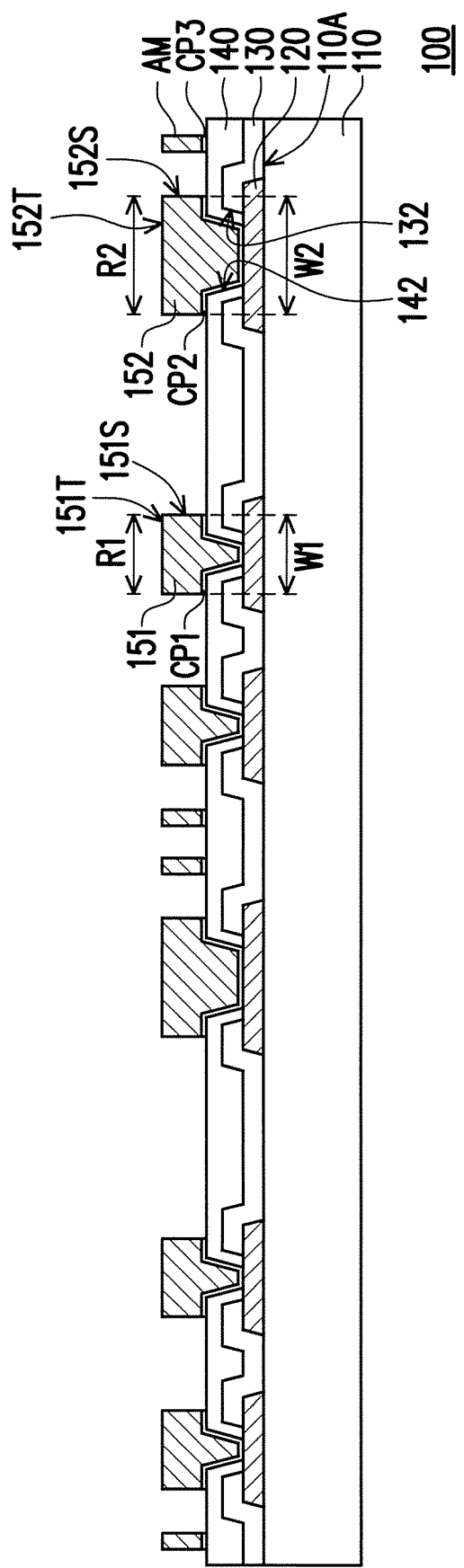
Figure 1C:
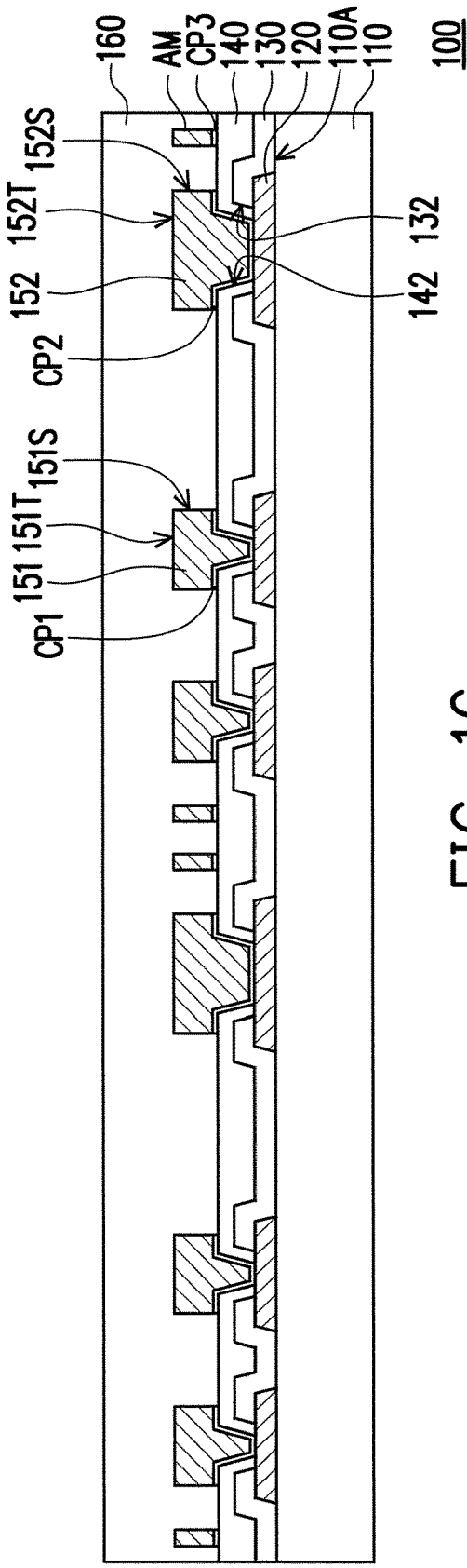
Figure 1D:
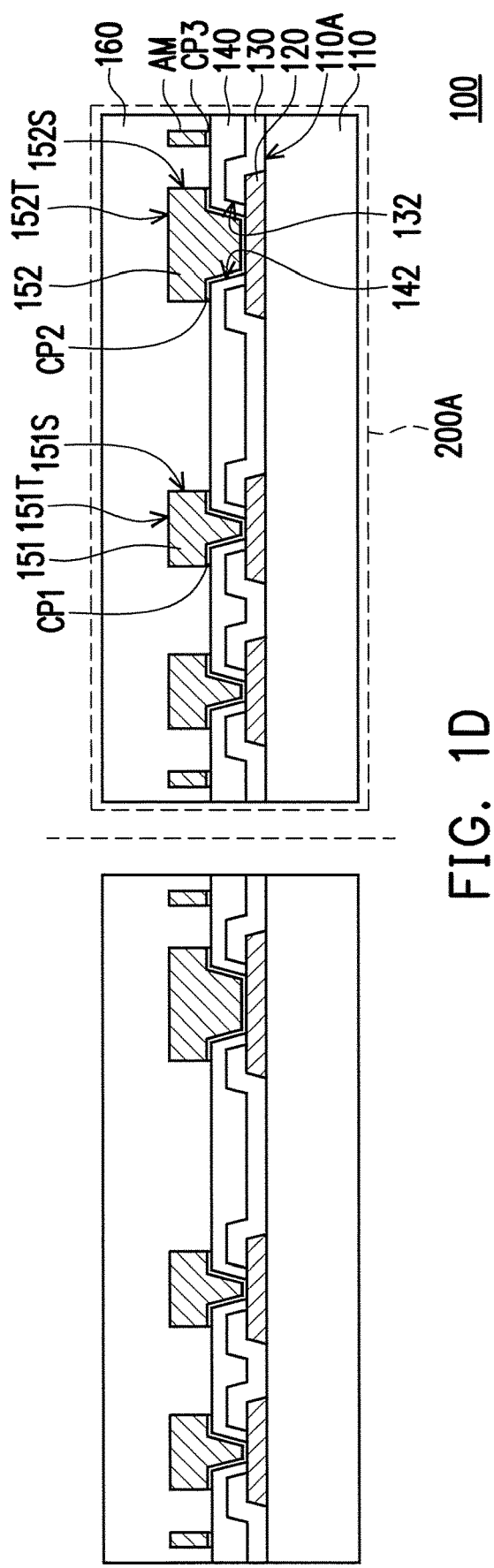

FIG. 1A to FIG. 1J illustrate cross-sectional views of various stages of fabricating a package structure in accordance with some exemplary embodiments of the disclosure. FIG. 2 is an enlarged, schematic top-plane view of conductive vias of an integrated circuit component in accordance with some exemplary embodiments of the disclosure. It is noted that FIG. 1D illustrates a cross sectional view of the integrated circuit component 200A in FIG. 2 along a cross-sectional line I-I'.

Referring to FIG. 1A, in some embodiments, a wafer 100 including a plurality of integrated circuit components 200A arranged in an array is provided. Before a wafer dicing process is performed on the wafer 100, the integrated circuit components 200A of the wafer 100 are connected to one another.

In some embodiments, each integrated circuit component 200A includes a semiconductor die 110 having an active surface 110A, a plurality of conductive pads 120 formed on the active surface 110A, and a passivation layer 130 disposed on the conductive pads 120. In some embodiments, the passivation layer 130 is formed over the semiconductor die 110, has a plurality of contact openings 132, and partially covers the conductive pads 120. In other words, the conductive pads 120 distributed on the active surface 110A of the semiconductor die 110 are partially exposed by contact openings 132 of the passivation layer 130.

In some embodiments, the semiconductor die 110 may be a silicon substrate including active components (e.g., transistors or the like) and/or passive components (e.g., resistors, capacitors, inductors or the like) formed therein. In some embodiments, the conductive pads 120 may be aluminum pads, copper pads or other suitable metal pads. In some embodiments, the passivation layer 130 may be a silicon oxide layer, a silicon nitride layer, a silicon oxy-nitride layer or a dielectric layer formed by other suitable dielectric materials. The disclosure is not limited thereto.

As shown in FIG. 1A, in some embodiments, each integrated circuit component 200A may further include a post-passivation layer 140 formed over the passivation layer 130. In some embodiments, the post-passivation layer 140 covers the passivation layer 130 and has a plurality of contact openings 142 exposing the conductive pads 120 exposed by the contact openings 132. In some embodiments, portions of the conductive pads 120 exposed by the contact openings 132 of the passivation layer 130 are partially covered by the post-passivation layer 140. In other words, the conductive pads 120 are partially exposed by the contact openings 142 of the post-passivation layer 140, respectively. For example, in some embodiments, the post-passivation layer 140 may be a polyimide (PI) layer, a polybenzoxazole (PBO) layer, or a dielectric layer formed by other suitable polymers. It is noted that the formation of the post-passivation layer 140 is optional in some alternative embodiments.

Referring to FIG. 1B, in some embodiments, contacting pads CP1 and contacting pads CP2 are formed on portions of the conductive pads 120 exposed by the contact openings 142 of the post-passivation layer 140, respectively. In some embodiments, the contacting pads CP1 and the contacting pads CP2 are formed on the post-passivation layer 140, where a portion of the contacting pads CP1 and a portion of the contacting pads CP2 are formed in the contact openings 142 to physically contact the conductive pads 120. In certain embodiments, the contacting pads CP1 and the contacting pads CP2 are correspondingly and electrically connected to the conductive pads 120.

In some embodiments, in a vertical projection on the active surface 110A of the semiconductor die 110, the contacting pads CP1 has a maximum size W1 and the contacting pads CP2 has a maximum size W2, where the maximum size W1 is different from the maximum size W2. In certain embodiments, the maximum size W1 of the contacting pads CP1 is in a range of about 20 μm to about 60 μm. In certain embodiments, the maximum size W2 of the contacting pads CP2 is in a range of about 80 μm to about 200 μm. In some embodiments, as shown in FIG. 1B, the maximum size W1 of the contacting pads CP1 is less than the maximum size W2 of the contacting pads CP2. In some embodiments, a ratio of the maximum size W1 of the contacting pads CP1 to the maximum size W2 of the contacting pads CP2 is in a range of about 0.1 to about 0.75. It is noted that the numbers of the contacting pads CP1 and the contacting pads CP2 are not limited in this disclosure.

Continued on FIG. 1B, in some embodiments, conductive vias 151 and conductive vias 152 are formed on the contacting pads CP1 and the contacting pads CP2, respectively. In some embodiments, the conductive vias 151 are electrically connected to the contacting pads CP1, and the conductive vias 152 are electrically connected to the contacting pads CP2. In certain embodiments, the contacting pads CP1 are correspondingly located between some of the conductive pads 120 and the conductive vias 151, and the contacting pads CP2 are correspondingly located between some of the conductive pads 120 and the conductive vias 152.

In some embodiments, each of the conductive vias 151 includes a top surface 151T and a sidewall 151S. In some embodiments, in the vertical projection on the active surface 110A of the semiconductor die 110, each of the conductive vias 151 has a maximum size R1 (see FIG. 2). In certain embodiments, the maximum size R1 of the conductive vias 151 is in a range of about 20 μm to about 60 μm. In some embodiments, each of the conductive vias 152 includes a top surface 152T and a sidewall 152S. In some embodiments, in the vertical projection on the active surface 110A of the semiconductor die 110, each of the conductive vias 152 has a maximum size R2 (see FIG. 2). In certain embodiments, the maximum size R2 of the conductive vias 152 is in a range of about 80 μm to about 200 μm. In some embodiments, as shown in FIG. 1B, the maximum size R1 of the conductive vias 151 is less than the maximum size R2 of the conductive vias 152. In certain embodiments, a ratio of the maximum size R1 of the conductive vias 151 to the maximum size R2 of the conductive vias 152 is in a range of about 0.1 to about 0.75.

Due to the configurations of the conductive vias 151 and the conductive vias 152, the conductive vias 151 are used to electrical connect the integrated circuit component 200A and other components included in the package structure (for example, for an electrical connection between two integrated circuit components, between an integrated circuit component and a redistribution circuit structure, etc.), and the conductive vias 152 are used to electrical connect the integrated circuit component 200A to a power source or to electrically ground the integrated circuit component 200A (for example, for an electrical connection between an integrated circuit component and an external component being electrically grounded or providing an electric power).

In some embodiments, the conductive vias 151 and/or the conductive vias 152 are copper vias or other metallic vias. In one embodiment, the material of the conductive vias 151 and the material of the conductive vias 152 may be the same. In an alternative embodiment, the materials of the conductive vias 151 and the conductive vias 152 may be different. The disclosure is not limited thereto.

In some embodiments, in the vertical projection on the active surface 110A, the conductive vias 151 and/or the conductive vias 152 may be in a circle-shape (see FIG. 2), an ellipse-shape, a triangle-shape, a rectangle-shape, or the like. In one embodiment, the shape of the conductive vias 151 may be the same as the shape of the conductive vias 152. In an alternative embodiment, the shape of the conductive vias 151 may be different from the shape of the conductive vias 152. The shapes of the conductive vias 151 and the conductive vias 152 are not limited according to the disclosure. In certain embodiments, in the vertical projection on the active surface 110A, the shapes the contacting pads CP1 and the contacting pads CP2 are similar to the shapes of the conductive vias 151 and the conductive vias 152.

In some embodiments, the conductive vias 151 and the conductive vias 152 are respectively formed on the contacting pads CP1 and the contacting pads CP2 through plating. For example, the conductive vias 151 and the conductive vias 152 are formed by sputtering a seed material layer (not shown) onto the post-passivation layer 140 and the conductive pads 120 exposed by the contact openings 142 of the post-passivation layer 140, forming a patterned photoresist layer (not shown) having openings exposing the conductive pads 120 over the seed material layer by photolithography, and immersing the wafer 100 including the patterned photoresist layer formed thereon into a plating solution so as to plate the conductive vias 151 and the conductive vias 152 on the seed material layer corresponding in position to the conductive pads 120. Due to the patterned photoresist layer, the size of the conductive vias 151 and the size of the conductive vias 152 can be easily modified by adjusting the sizes of the openings in the patterned photoresist layer.

Then, the contacting pads CP1 and the contacting pads CP2 are formed by removing the patterned photoresist layer after forming the conductive vias 151 and conductive vias 152, and using the conductive vias 151 and the conductive vias 152 as a hard mask to remove portions of the seed layer not covered by the conductive vias 151 and the conductive vias 152 until the post-passivation layer 140 is exposed so as to form the contacting pads CP1 and the contacting pads CP2 respectively located between the conductive pads 120 and the conductive vias 151 and between the conductive pads 120 and the conductive vias 152. In some embodiments, the portions of the seed layer not covered by the conductive vias 151 and the conductive vias 152 are removed by an etching process. It is noted that the formation of the contacting pads CP1 and the contacting pads CP2 are optional in some alternative embodiments. The disclosure is not limited thereto. The numbers of the contacting pads CP1 and the contacting pads CP2 may respectively correspond to the numbers of the conductive vias 151 and the conductive vias 152.

In an alternative embodiment, the conductive vias 151 and the conductive vias 152 may be fabricated in different steps. For example, in one embodiment, the conductive vias 151 and the contacting pads CP1 may be formed prior to the formations of the conductive vias 152 and the contacting pads CP2. In one embodiment, the conductive vias 151 and the contacting pads CP1 may be formed after the formations of the conductive vias 152 and the contacting pads CP2, for example.

Referring to FIG. 1B, in some embodiments, during the fabricating of the conductive vias 151 and the conductive vias 152, one or more alignment marks AM may be formed on a top surface of the post-passivation layer 140 facing away from the active surface 110A of the semiconductor die 110. In some embodiments, the conductive vias 151, the conductive vias 152 and the alignment marks AM are fabricated by the same process. In such embodiments, the materials of the conductive vias 151 and the conductive vias 152 are the same as the material of the alignment marks AM. In some embodiments, the alignment marks AM may be L-shaped alignment marks (see FIG. 2), cross-shaped alignment marks or alignment marks with other shapes. The shape and number of the alignment marks AM are not limited according to the disclosure. The size of the alignment marks AM can be easily modified by adjusting the sizes of the openings in the patterned photoresist layer. It is noted that the fabrication of the alignment marks AM is optional in some alternative embodiments. In some embodiments, the alignment marks AM are recognizable and feasible in an infrared (IR) alignment process. In the disclosure, the alignment marks AM are electrically isolated from the conductive vias 151, the conductive vias 152, and the conductive pads 120.

In some embodiments, during the fabricating of the contacting pads CP1 and the contacting pads CP2, contacting pads CP3 may be formed between the top surface of the post-passivation layer 140 and the alignment marks AM. In some embodiments, the contacting pads CP1, the contacting pads CP2 and contacting pads CP3 are fabricated by the same process. In such embodiments, the materials of the contacting pads CP1 and the contacting pads CP2 are the same as the material of the contacting pads CP3. The number of the contacting pads CP3 may correspond to the number of the alignment marks AM. It is noted that the formation of the contacting pads CP3 is optional in some alternative embodiments.

In an alternative embodiment, the alignment marks AM, the conductive vias 151 and the conductive vias 152 may be fabricated in different steps, the disclosure is not limited thereto. For example, the alignment marks AM and the contacting pads CP3 may be respectively formed prior to or after the formations of the conductive vias 151 and the contacting pads CP1 and/or prior to or after the formations of the conductive vias 152 and the contacting pads CP2.

Referring to FIG. 1C, in some embodiments, after the conductive vias 151, the conductive vias 152 and the alignment marks AM are formed on each integrated circuit component 200A, a protection layer 160 is formed on the post-passivation layer 140, and covers the top surfaces 151T and the sidewalls 151S of the conductive vias 151, the top surfaces 152T and the sidewalls 152S of the conductive vias 152, and top surfaces and sidewalls of the alignment marks AM. In other words, the conductive vias 151, the conductive vias 152 and the alignment marks AM are encapsulated in the protection layer 160. As shown in FIG. 1C, for example, the top surfaces 151T and the sidewalls 151S of the conductive vias 151, the top surfaces 152T and the sidewalls 152S of the conductive vias 152, and the top surfaces and the sidewalls of the alignment marks AM are not revealed by the protection layer 160 and are in physical contact with the protection layer 160. In some embodiments, the protection layer 160 may be a dielectric layer, such as a polybenzoxazole (PBO) layer, a polyimide (PI) layer or other suitable polymer layer. In some alternative embodiments, the protection layer 160 may be made of inorganic materials, such as silicon oxide, silicon nitride, silicon oxynitride, or any suitable dielectric material. In some embodiments, the protection layer 160 may be formed by deposition, or the like. In some embodiments, the materials of the protection layer 160 and the post-passivation layer 140 may be the same. In an alternative embodiment, the material of the protection layer 160 may be different from the material of the post-passivation layer 140. The disclosure is not limited thereto.

Referring to FIG. 1D, in some embodiments, a dicing process (e.g., singulation) is performed to cut the wafer 100, such that the wafer 100 are cut into singulated and separate integrated circuit components 200A. In some embodiments, the dicing process may include a wafer dicing process. Up to this, the integrated circuit components 200A are manufactured.

In some embodiments, as shown in FIG. 1D, each of the integrated circuit components 200A includes the semiconductor die 110 having the active surface 110A, the conductive pads 120 formed on the active surface 110A of the semiconductor die 110, the passivation layer 130, the post-passivation layer 140, the contacting pads CP1, the contacting pads CP2, the contacting pads CP3, the conductive vias 151, the conductive vias 152, the alignment marks AM, and the protection layer 160. In some embodiments, the contacting pads CP1 are located between the conductive pads 120 and the conductive vias 151 for electrically connecting the conductive pads 120 and the conductive vias 151. In some embodiments, the contacting pads CP2 are located between the conductive pads 120 and the conductive vias 152 for electrically connecting the conductive pads 120 and the conductive vias 152. In some embodiments, the contacting pads CP3 are located between the post-passivation layer 140 and the alignment marks AM.

In some embodiments, the protection layer 160 covers the contacting pads CP1, the contacting pads CP2, the contacting pads CP3, the conductive vias 151, the conductive vias 152, and the alignment marks AM. In other words, as shown in FIG. 1D, the protection layer 160 is in physical contact with the sidewalls of the contacting pads CP1, the sidewalls of the contacting pads CP2, the sidewalls of the contacting pads CP3, the top surfaces 151T and the sidewalls 151S of the conductive vias 151, the top surfaces 152T and the sidewalls 152S of the conductive vias 152, and the top surfaces and the sidewalls of the alignment marks AM, such that the contacting pads CP1, the contacting pads CP2, the contacting pads CP3, the conductive vias 151, the conductive vias 152, and the alignment marks AM are well-protected by the protection layer 160.

Referring to FIG. 1D and FIG. 2, the conductive vias 151 and the conductive vias 152 are disposed on the active surface 110A. In FIG. 2, certain structural features including the conductive vias 151, the conductive vias 152, and the active surface 110A of the semiconductor die 110 are stressed for illustration purposes, and only twelve conductive vias 151 and six conductive vias 152 are shown in FIG. 2 for easy illustration. In some embodiments, for each integrated circuit component 200A, the active surface 110A of the semiconductor die 110 has a region RN1 for electrical connecting to other components included in the package structure (for example, for an electrical connection between two integrated circuit components, between an integrated circuit component and a redistribution circuit structure, etc.) and a region RN2 for electrical connecting to a power source or electrically grounded (for example, for an electrical connection between an integrated circuit component and an external component being electrically grounded or providing an electric power).

In some embodiments, as shown in FIG. 2, the conductive vias 151 are disposed in the region RN1 of the active surface 110A, and the conductive vias 152 are disposed in the region RN2 of the active surface 110A. In some embodiments, the maximum size R1 of the conductive vias 151 is less than the maximum size R2 of the conductive vias 152. In some embodiments, in the vertical projection on the active surface 110A of the semiconductor die 110, the shape of the conductive vias 151 and the shape of the conductive vias 152 are substantially the same. As shown in FIG. 2, in the vertical projection on the active surface 110A of the semiconductor die 110, the shapes of the conductive vias 151 and the shapes of the conductive vias 152 are circular, for example.

In certain embodiments, the conductive vias 151 are arranged in a form of an array along a first direction X and a second direction Y in the region RN1 of the active surface 110A of the semiconductor die 110, where the first direction X is not parallel to the second direction Y. In some embodiments, the first direction X is substantially perpendicular to the second direction Y. As shown in FIG. 2, for example, every two adjacent conductive vias 151 immediately arranged along the first direction X are separated apart by a distance D1, and every two adjacent conductive vias 151 immediately arranged along the second direction Y are separated apart by a distance D2. In some embodiments, as shown in FIG. 2, the distance D1 is substantially equal to the distance D2, however the disclosure is not limited thereto. In an alternative embodiment, the distance D1 may be greater than the distance D2. In an alternative embodiment, the distance D1 may be less than the distance D2. In certain embodiments, the maximum size R1 of the conductive vias 151 is in a range of about 20 μm to about 60 μm.

In certain embodiments, as shown in FIG. 2, the conductive vias 152 are arranged into parallel lines along a diagonal direction U and separated from one another by a distance G1, or are arranged into parallel lines along a diagonal direction V and separated from one another by a distance G2. Note that, the diagonal direction U is substantially perpendicular to the diagonal direction V, and the diagonal direction U and the diagonal direction V are different from the first direction X and the second direction Y. That is to say, the conductive vias 152 are arranged in a form of an array along the diagonal direction U and the diagonal direction V in the region RN2 of the active surface 110A of the semiconductor die 110. In some embodiments, the distance G1 is substantially equal to the distance G2; however, the disclosure is not limited thereto, in an alternative embodiment, the distance G1 may be greater than or less than the distance G2. In other words, as shown in FIG. 2, in certain embodiments, every two adjacent conductive vias 152 immediately arranged along the first direction X are separated apart by a distance D3, and every two adjacent conductive vias 152 immediately arranged along the second direction Y are separated apart by a distance D4, where the conductive vias 152 are respectively arranged along the first direction X in a stagger manner and along the second direction Y in a stagger manner. In some embodiments, the distance D3 is substantially equal to the distance D4, however the disclosure is not limited thereto. In an alternative embodiment, the distance D3 is greater than the distance D4. In an alternative embodiment, the distance D3 is less than the distance D4. In certain embodiments, the maximum size R2 of the conductive vias 152 is in a range of 80 μm to 200 μm.

Figure 5:
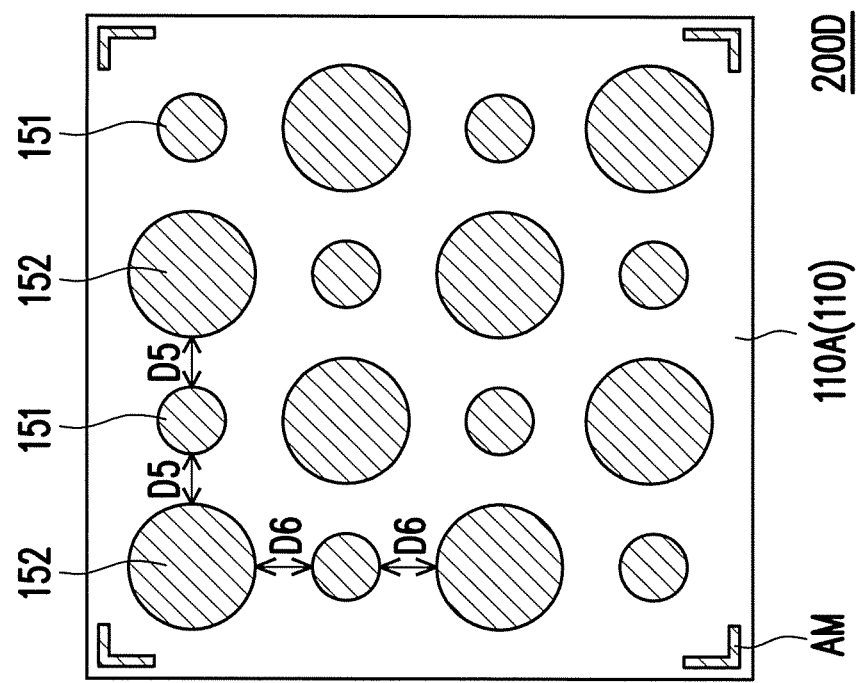
FIG. 5 is an enlarged, schematic top-plane view of conductive vias of an integrated circuit component in accordance with some exemplary embodiments of the disclosure.
Figure 6:
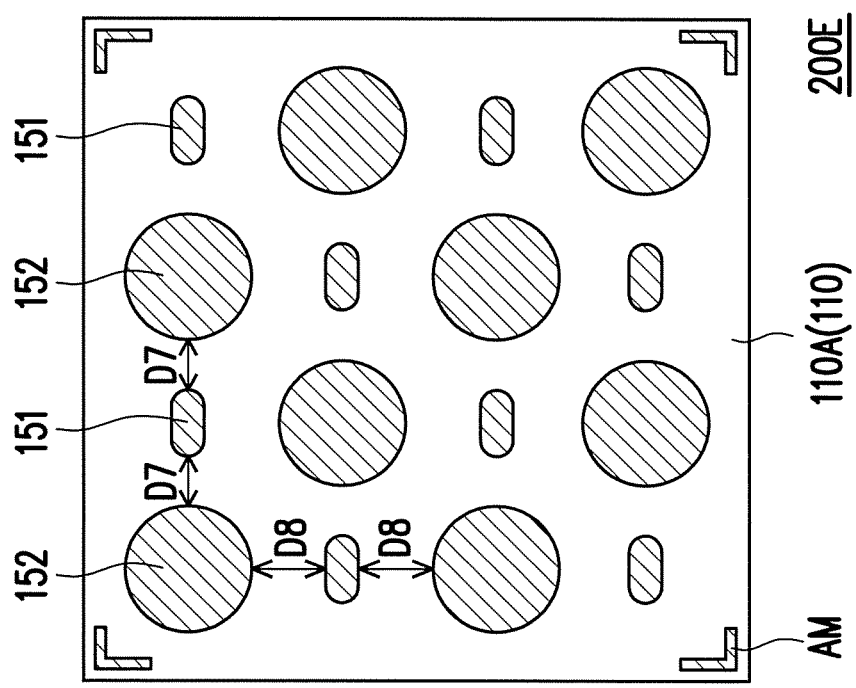
FIG. 6 is an enlarged, schematic top-plane view of conductive vias of an integrated circuit component in accordance with some exemplary embodiments of the disclosure.

However, the arrangements of the conductive vias 151 and the conductive vias 152 are not specifically limited to the integrated circuit component 200A depicted in FIG. 2. In some embodiments, various modifications of the configuration relationship of the conductive vias 151 and the conductive vias 152 are shown in FIG. 4 to FIG. 6. However, the disclosure is not limited thereto.

Figure 2:
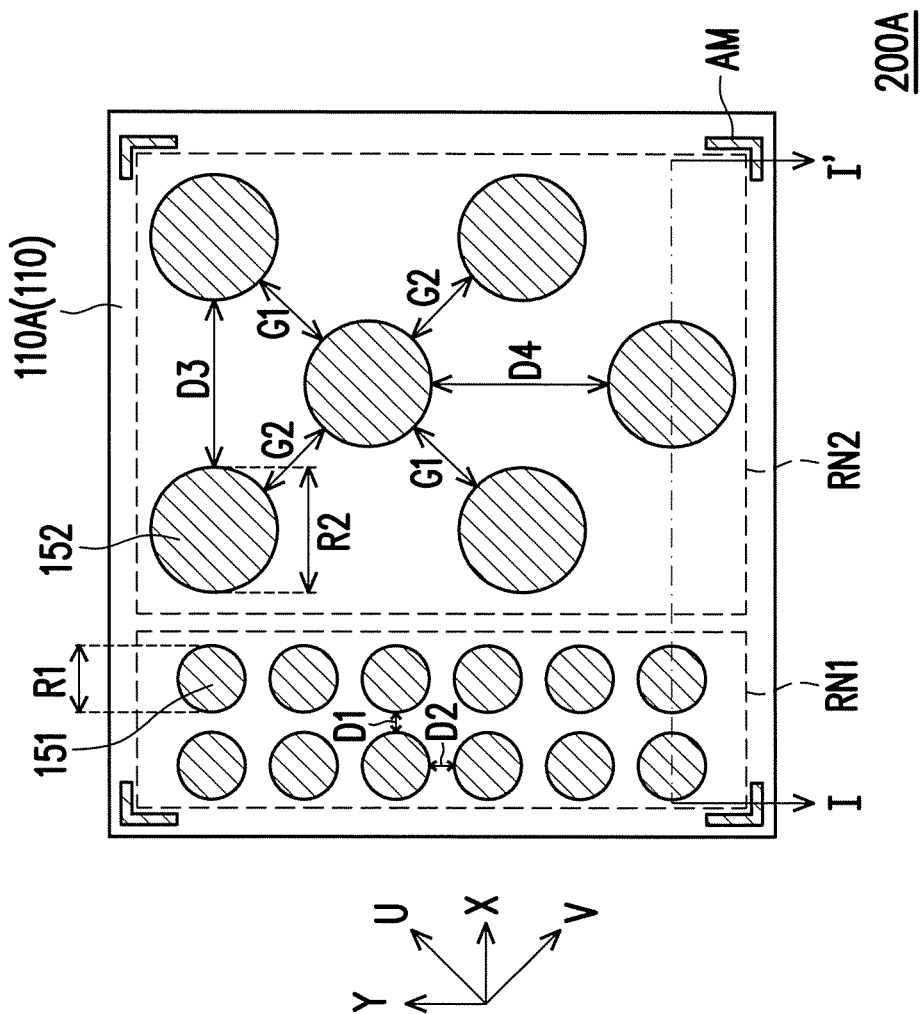
FIG. 2 is an enlarged, schematic top-plane view of conductive vias of an integrated circuit component in accordance with some exemplary embodiments of the disclosure.
Figure 3:
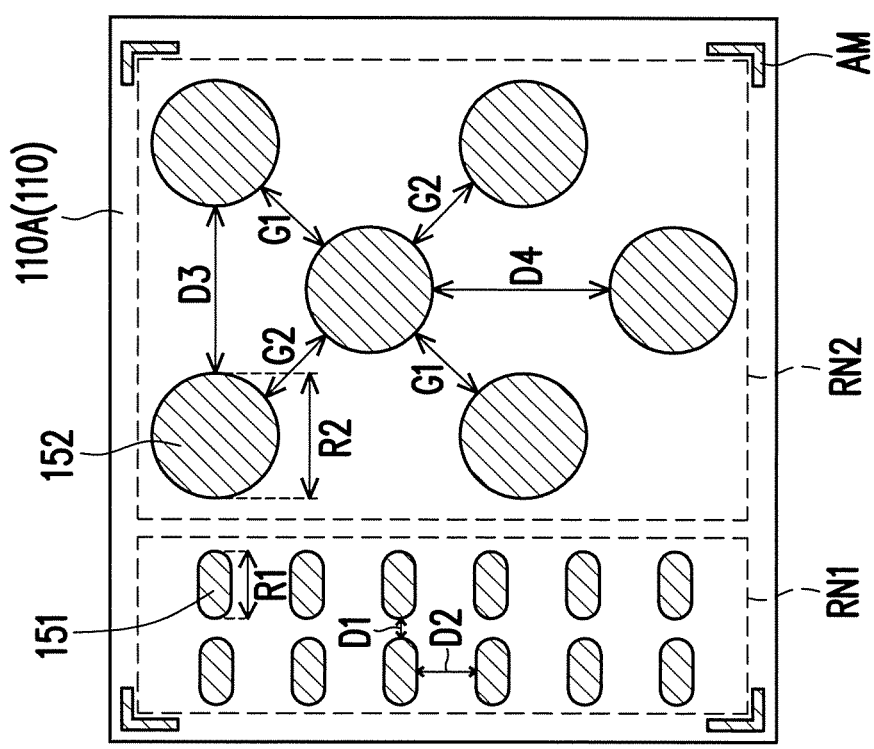
FIG. 3 is an enlarged, schematic top-plane view of conductive vias of an integrated circuit component in accordance with some exemplary embodiments of the disclosure.

FIG. 3 is an enlarged, schematic top-plane view of conductive vias of an integrated circuit component in accordance with some exemplary embodiments of the disclosure. In an alternative embodiment, the integrated circuit component 200A having the arrangement of the conductive vias 151 and the conductive vias 152 illustrated in FIG. 2 can be replaced by an integrated circuit component 200B having the arrangement of the conductive vias 151 and the conductive vias 152 illustrated in FIG. 3. Referring to FIG. 2 and FIG. 3 together, the integrated circuit component 200A depicted in FIG. 2 and an integrated circuit component 200B depicted in FIG. 3 are similar to each other, where the difference is that, in the vertical projection on the active surface 110A of the semiconductor die 110, the shape of the conductive vias 151 and the shape of the conductive vias 152 are different from each other. The elements depicted in FIG. 3 similar to or substantially the same as the elements described above in FIG. 2 will use the same reference numbers, and certain details or descriptions of the same elements will not be repeated herein. In some embodiments, as shown in FIG. 3, in the vertical projection on the active surface 110A of the semiconductor die 110, the shapes of the conductive vias 151 are elliptic, and the shapes of the conductive vias 152 are circular, for example.

In FIG. 3, certain structural features including the conductive vias 151, the conductive vias 152, and the active surface 110A of the semiconductor die 110 are stressed for illustration purposes, and only twelve conductive vias 151 and six conductive vias 152 are shown in FIG. 3 for easy illustration. In some embodiments, the active surface 110A of the semiconductor die 110 has the region RN1 and the region RN2, where the conductive vias 151 are disposed on the region RN1 of the active surface 110A, and the conductive vias 152 are disposed on the region RN2 of the active surface 110A. In some embodiments, as shown in FIG. 3, the maximum size R1 of the conductive vias 151 is less than the maximum size R2 of the conductive vias 152.

In certain embodiments, the conductive vias 151 are arranged in a form of an array along the first direction X and the second direction Y on the region RN1 of the active surface 110A. As shown in FIG. 3, for example, every two adjacent conductive vias 151 immediately arranged along the first direction X are separated apart by the distance D1, and every two adjacent conductive vias 151 immediately arranged along the second direction Y are separated apart by the distance D2. In some embodiments, as shown in FIG. 3, the distance D1 is less than to the distance D2, however the disclosure is not limited thereto. In an alternative embodiment, the distance D1 may be greater than the distance D2. In an alternative embodiment, the distance D1 is substantially equal to the distance D2. In certain embodiments, the maximum size R1 of the conductive vias 151 is in a range of about 20 μm to about 60 μm.

In certain embodiments, as shown in FIG. 3, the conductive vias 152 are arranged into parallel lines along a diagonal direction U and separated from one another by the distance G1, or are arranged into parallel lines along a diagonal direction V and separated from one another by the distance G2. That is to say, the conductive vias 152 are arranged in a form of an array along the diagonal direction U and the diagonal direction V on the region RN2 of the active surface 110A. In some embodiments, the distance G1 is substantially equal to the distance G2; however, the disclosure is not limited thereto, in an alternative embodiment, the distance G1 may be greater than or less than the distance G2. In other words, as shown in FIG. 3, in certain embodiments, every two adjacent conductive vias 152 immediately arranged along the first direction X are separated apart by the distance D3, and every two adjacent conductive vias 152 immediately arranged along the second direction Y are separated apart by the distance D4, where the conductive vias 152 are respectively arranged along the first direction X in a stagger manner and along the second direction Y in a stagger manner. In some embodiments, the distance D3 is substantially equal to the distance D4, however the disclosure is not limited thereto. In an alternative embodiment, the distance D3 is greater than the distance D4. In an alternative embodiment, the distance D3 is less than the distance D4. In certain embodiments, the maximum size R2 of the conductive vias 152 is in a range of 80 μm to 200 μm.

Figure 4A:
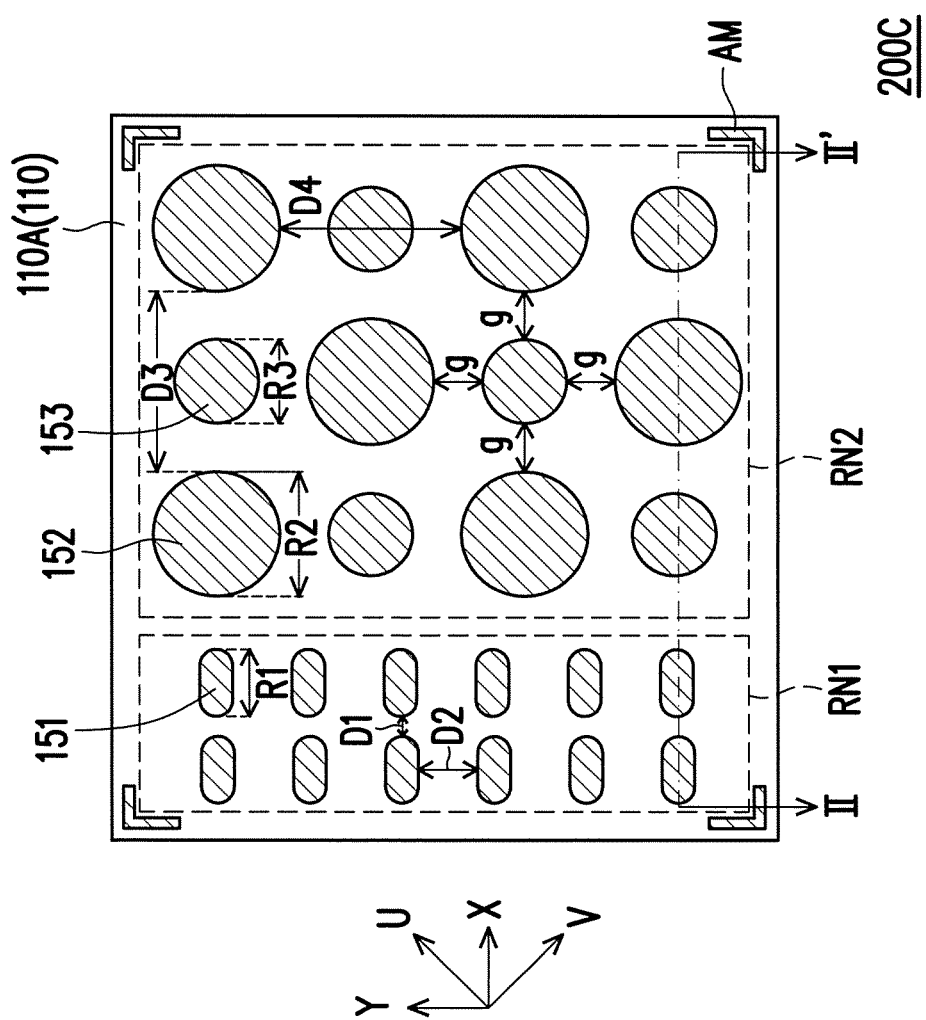
FIG. 4A is an enlarged, schematic top-plane view of conductive vias of an integrated circuit component in accordance with some exemplary embodiments of the disclosure.
Figure 4B:
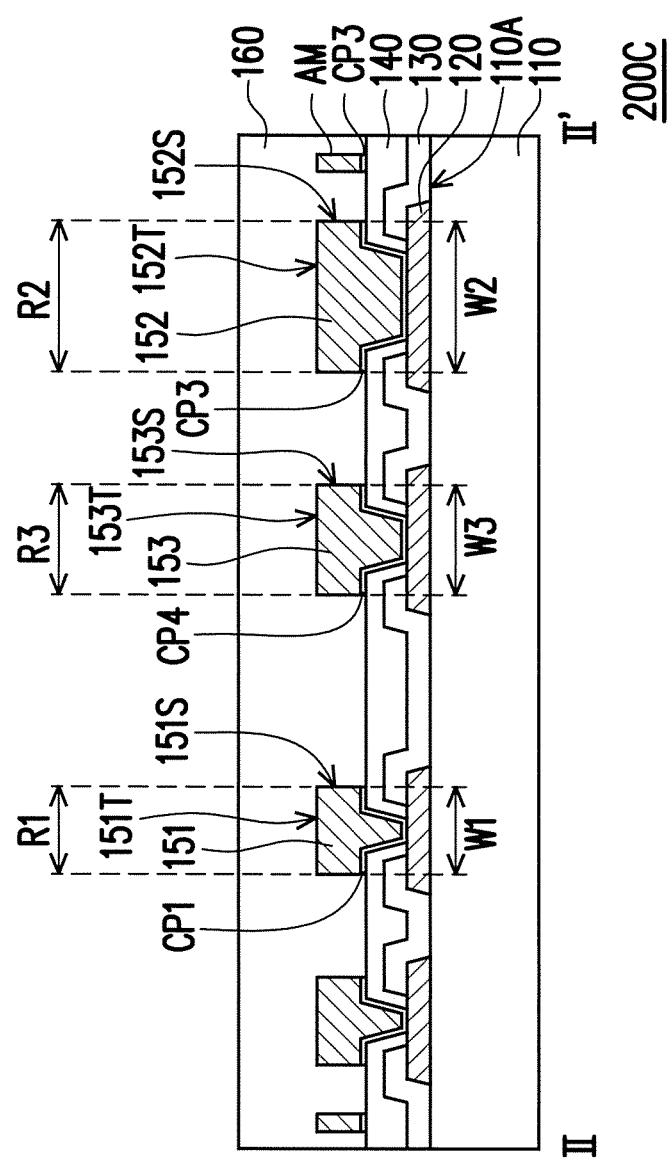
FIG. 4B is a schematic cross-sectional view of the integrated circuit component along a line II-II' depicted in FIG. 4A.

FIG. 4A is an enlarged, schematic top-plane view of conductive vias of an integrated circuit component in accordance with some exemplary embodiments of the disclosure. FIG. 4B is a schematic cross-sectional view of the integrated circuit component along a line II-II' depicted in FIG. 4A. Referring to FIG. 3 and FIG. 4A-FIG. 4B together, the integrated circuit component 200B depicted in FIG. 3 and an integrated circuit component 200C depicted in FIG. 4A and FIG. 4B are similar to each other, where the difference is that an additional element (i.e. dummy vias 153) is further included in the integrated circuit component 200C. The elements depicted in FIG. 4A and FIG. 4B similar to or substantially the same as the elements described above in FIG. 3 will use the same reference numbers, and certain details or descriptions of the same elements will not be repeated herein. In some embodiments, as shown in FIG. 4A and FIG. 4B, one or more dummy vias 153 may further be included in the integrated circuit component 200B of the disclosure to form the integrated circuit component 200C depicted in FIG. 4A and FIG. 4B.

Referring to FIG. 4A, certain structural features including the conductive vias 151, the conductive vias 152, the dummy vias 153, and the active surface 110A of the semiconductor die 110 are stressed for illustration purposes, and only twelve conductive vias 151, six conductive vias 152, and six dummy vias 153 are shown in FIG. 4A for easy illustration. In some embodiments, the active surface 110A of the semiconductor die 110 has the region RN1 and the region RN2, where the conductive vias 151 are disposed on the region RN1 of the active surface 110A, and the conductive vias 152 and the dummy vias 153 are disposed on the region RN2 of the active surface 110A. In some embodiments, as shown in FIG. 4A, the maximum size R1 of the conductive vias 151 is less than the maximum size R2 of the conductive vias 152 and is less than the maximum size R3 of the dummy vias 153. It is noted that the arrangement of the conductive vias 151 and the conductive vias 152 illustrated in FIG. 2 and the arrangement of the conductive vias 151 and the conductive vias 152 illustrated in FIG. 4A are similar to or substantially the same, and therefore, certain details or descriptions of the arrangement of the conductive vias 151 and the conductive vias 152 will not be repeated herein, for simplicity.

In some embodiments, as shown in FIG. 4A, the conductive vias 152 and the dummy vias 153 are disposed on the region RN2 of the active surface 110A. In certain embodiments, the conductive vias 152 and the dummy vias 153 are arranged in a form of an array, where the conductive vias 152 and the dummy vias 153 are alternately arranged along the first direction X and the second direction Y on the region RN2 of the active surface 110A and are separated from each other by a constant distance g. That is, as shown in FIG. 4A, similar to the conductive vias 152, the dummy vias 153 are arranged into parallel lines along a diagonal direction U, or are arranged into parallel lines along a diagonal direction V. That is to say, the dummy vias 153 are arranged in a form of an array along the diagonal direction U and the diagonal direction V on the region RN2 of the active surface 110A. In other words, as shown in FIG. 4A, in certain embodiments, the dummy vias 153 are respectively arranged along the first direction X in a stagger manner and along the second direction Y in a stagger manner. In certain embodiments, the maximum size R3 of the dummy vias 153 is in a range of 60 μm to 120 μm. As shown in FIG. 4A and FIG. 4B, the dummy vias 153 are electrically isolated from the conductive vias 151 and the conductive vias 152. In other words, the dummy vias 153 are not in contact with the conductive vias 152 and not in contact with the conductive vias 151.

Referring to FIG. 4B, in some embodiments, during the fabricating of the conductive vias 151 and the conductive vias 152, the dummy vias 153 may be formed on the active surface 110A of the semiconductor die 110A and formed on the top surface of the post-passivation layer 140. In some embodiments, top surfaces 153S and sidewalls 153S of dummy vias 153 are in physical contact with the protection layer 160. In other words, the dummy vias 153 are electrically isolated from the conductive pads 120. In some embodiments, the conductive vias 151, the conductive vias 152 and the dummy vias 153 are fabricated by the same process. In such embodiments, the material of the dummy vias 153 is substantially the same as the materials of the conductive vias 151 and the conductive vias 152. In some embodiments, the dummy vias 153 may be in a circle-shape (see FIG. 4A), an ellipse-shape, a triangle-shape, a rectangle-shape, or the like. The shape and number of the dummy vias 153 are not limited according to the disclosure. The sizes of the dummy vias 153 can be easily modified by adjusting the sizes of the openings in the patterned photoresist layer. It is noted that the fabrication of the dummy vias 153 is optional in some alternative embodiments.

In some embodiments, during the fabricating of the contacting pads CP1 and the contacting pads CP2, contacting pads CP4 may be formed between the top surface of the post-passivation layer 140 and the dummy vias 153 (see FIG. 4B). In certain embodiments, the maximum size W3 of the contacting pads CP4 is in a range of about 60 μm to about 120 μm. In some embodiments, the contacting pads CP1, the contacting pads CP2 and contacting pads CP4 are fabricated by the same process. In such embodiments, the material of the contacting pads CP4 is substantially the same as the materials of the contacting pads CP1 and the contacting pads CP2. The number of the contacting pads CP4 may correspond to the number of the dummy vias 153. It is noted that the formation of the contacting pads CP4 is optional in some alternative embodiments.

In an alternative embodiment, the dummy vias 153, the conductive vias 151 and the conductive vias 152 may be fabricated in different steps, the disclosure is not limited thereto. For example, the dummy vias 153 and the contacting pads CP4 may be respectively formed prior to or after the formations of the conductive vias 151 and the contacting pads CP1 and/or prior to or after the formations of the conductive vias 152 and the contacting pads CP2.

FIG. 5 is an enlarged, schematic top-plane view of conductive vias of an integrated circuit component in accordance with some exemplary embodiments of the disclosure. In an alternative embodiment, the integrated circuit component 200A having the arrangement of the conductive vias 151 and the conductive vias 152 illustrated in FIG. 2 can be replaced by an integrated circuit component 200D having the arrangement of the conductive vias 151 and the conductive vias 152 illustrated in FIG. 5.

In FIG. 5, certain structural features including the conductive vias 151, the conductive vias 152, and the active surface 110A of the semiconductor die 110 are stressed for illustration purposes, and only eight conductive vias 151 and eight conductive vias 152 are shown in FIG. 5 for easy illustration. In some embodiments, as shown in FIG. 5, the maximum size R1 of the conductive vias 151 is less than the maximum size R2 of the conductive vias 152. In some embodiments, in the vertical projection on the active surface 110A of the semiconductor die 110, the shape of the conductive vias 151 and the shape of the conductive vias 152 are substantially the same. As shown in FIG. 5, in the vertical projection on the active surface 110A of the semiconductor die 110, the shapes of the conductive vias 151 and the shapes of the conductive vias 152 are circular, for example.

In certain embodiments, the conductive vias 151 and the conductive vias 152 are arranged in a form of an array along the first direction X and the second direction Y on the active surface 110A of the semiconductor die 110. As shown in FIG. 5, the conductive vias 151 and the conductive vias 152 are alternately arranged along the first direction X, and the conductive vias 151 and the conductive vias 152 are alternately arranged along the second direction Y. In some embodiments, along the first direction X, one of the conductive vias 151 and one of the conductive vias 152 are separated apart by a distance D5; and along the second direction Y, one of the conductive vias 151 and one of the conductive vias 152 are separated apart by a distance D6. In some embodiments, the distance D5 is substantially equal to the distance D6, however the disclosure is not limited thereto. In an alternative embodiment, the distance D5 is greater than the distance D6. In an alternative embodiment, the distance D5 is less than the distance D6.

In certain embodiments, the conductive vias 151 are arranged into parallel lines along the diagonal direction U and/or the diagonal direction V. In certain embodiments, the conductive vias 152 are arranged in parallel along the diagonal direction U and/or the diagonal direction V. In other words, the conductive vias 151 and the conductive vias 152 are not alternately arranged along the diagonal direction U and the diagonal direction V.

FIG. 6 is an enlarged, schematic top-plane view of conductive vias of an integrated circuit component in accordance with some exemplary embodiments of the disclosure. In an alternative embodiment, the integrated circuit component 200D having the arrangement of the conductive vias 151 and the conductive vias 152 illustrated in FIG. 5 can be replaced by an integrated circuit component 200E having the arrangement of the conductive vias 151 and the conductive vias 152 illustrated in FIG. 6. Referring to FIG. 5 and FIG. 6 together, the integrated circuit component 200D depicted in FIG. 6 and an integrated circuit component 200E depicted in FIG. 6 are similar to each other, where the difference is that, in the vertical projection on the active surface 110A of the semiconductor die 110, the shape of the conductive vias 151 and the shape of the conductive vias 152 are different from each other. The elements depicted in FIG. 6 similar to or substantially the same as the elements described above in FIG. 5 will use the same reference numbers, and certain details or descriptions of the same elements will not be repeated herein.

In FIG. 6, certain structural features including the conductive vias 151, the conductive vias 152, and the active surface 110A of the semiconductor die 110 are stressed for illustration purposes, and only eight conductive vias 151 and eight conductive vias 152 are shown in FIG. 6 for easy illustration. In some embodiments, as shown in FIG. 6, the maximum size R1 of the conductive vias 151 is less than the maximum size R2 of the conductive vias 152. In some embodiments, in the vertical projection on the active surface 110A of the semiconductor die 110, the shape of the conductive vias 151 and the shape of the conductive vias 152 are different from each other. In some embodiments, as shown in FIG. 6, in the vertical projection on the active surface 110A of the semiconductor die 110, the shapes of the conductive vias 151 are elliptic, and the shapes of the conductive vias 152 are circular.

In certain embodiments, the conductive vias 151 and the conductive vias 152 are arranged in a form of an array along the first direction X and the second direction Y on the active surface 110A of the semiconductor die 110. As shown in FIG. 6, the conductive vias 151 and the conductive vias 152 are alternately arranged along the first direction X, and the conductive vias 151 and the conductive vias 152 are alternately arranged along the second direction Y. In some embodiments, along the first direction X, one of the conductive vias 151 and one of the conductive vias 152 are separated apart by a distance D7; and along the second direction Y, one of the conductive vias 151 and one of the conductive vias 152 are separated apart by a distance D8. In some embodiments, the distance D7 is less than the distance D8, however the disclosure is not limited thereto. In an alternative embodiment, the distance D7 is greater than the distance D8. In an alternative embodiment, the distance D7 is substantially equal to the distance D8.

As shown in FIG. 6, in certain embodiments, the conductive vias 151 are arranged in parallel along the diagonal direction U and/or the diagonal direction V. In certain embodiments, the conductive vias 152 are arranged in parallel along the diagonal direction U and/or the diagonal direction V. In other words, the conductive vias 151 and the conductive vias 152 are not alternately arranged along the diagonal direction U and the diagonal direction V.

Figure 1E:
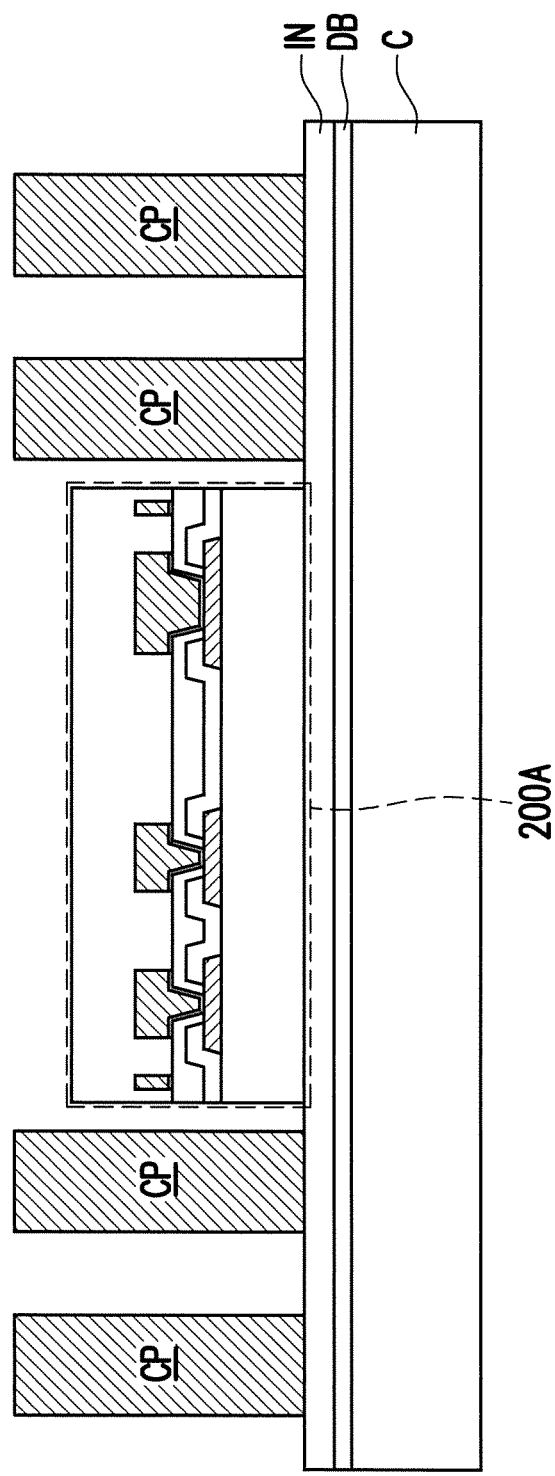

Referring to FIG. 1E, in some embodiments, a carrier C having a de-bonding layer DB and an insulating layer IN formed thereon is provided. In some embodiments, the de-bonding layer DB is between the carrier C and the insulating layer IN. In some embodiments, the carrier C is a glass substrate, the de-bonding layer DB is a light-to-heat conversion (LTHC) release layer formed on the glass substrate, and the insulating layer IN is a polybenzoxazole (PBO) layer formed on the de-bonding layer DB, for example. It is noted that the formation of the insulating layer IN is optional in some alternative embodiments. It may also be noted that materials for the carrier C, the de-bonding layer DB, and the insulating layer IN are not limited to what are disclosed herein according to the disclosure.

In some embodiments, after the carrier C having the de-bonding layer DB and the insulating layer IN formed thereon is provided, a plurality of conductive pillars CP are formed on the insulating layer IN. In some embodiments, the conductive pillars CP are formed over the carrier C (e.g., directly on the insulating layer IN) by photolithography, plating, and photoresist stripping process. In some alternative embodiments, the conductive pillars CP are pre-fabricated through other processes and are mounted over the carrier C. For example, the conductive pillars CP include copper posts or other metallic posts.

Continued on FIG. 1E, in some embodiments, one of the integrated circuit components 200A depicted in FIG. 1D may be picked-up and placed on the insulating layer IN carried by the carrier C. In some embodiments, the integrated circuit component 200A is attached or adhered on the insulating layer IN through a die attach film, an adhesion paste or the like. In some embodiments, the integrated circuit component 200A may have a thickness less than a height of the conductive pillars CP, as shown in FIG. 1E. However, the disclosure is not limited thereto. In an alternative embodiment, the thickness of the integrated circuit component 200A may be greater than or substantially equal to the height of the conductive pillars CP. As shown in FIG. 1E, the integrated circuit component 200A may be picked-up and placed on the insulating layer IN after the formation of the conductive pillars CP. However, the disclosure is not limited thereto. In an alternative embodiment, the integrated circuit component 200A may be picked-up and placed on the insulating layer IN before the formation of the conductive pillars CP. Additionally, the integrated circuit component 200A may be replaced by the integrated circuit component 200B depicted in FIG. 3, the integrated circuit component 200C depicted in FIG. 4A, the integrated circuit component 200D depicted in FIG. 5, or the integrated circuit component 200E depicted in FIG. 6, the disclose is not limited thereto.

Figure 1F:
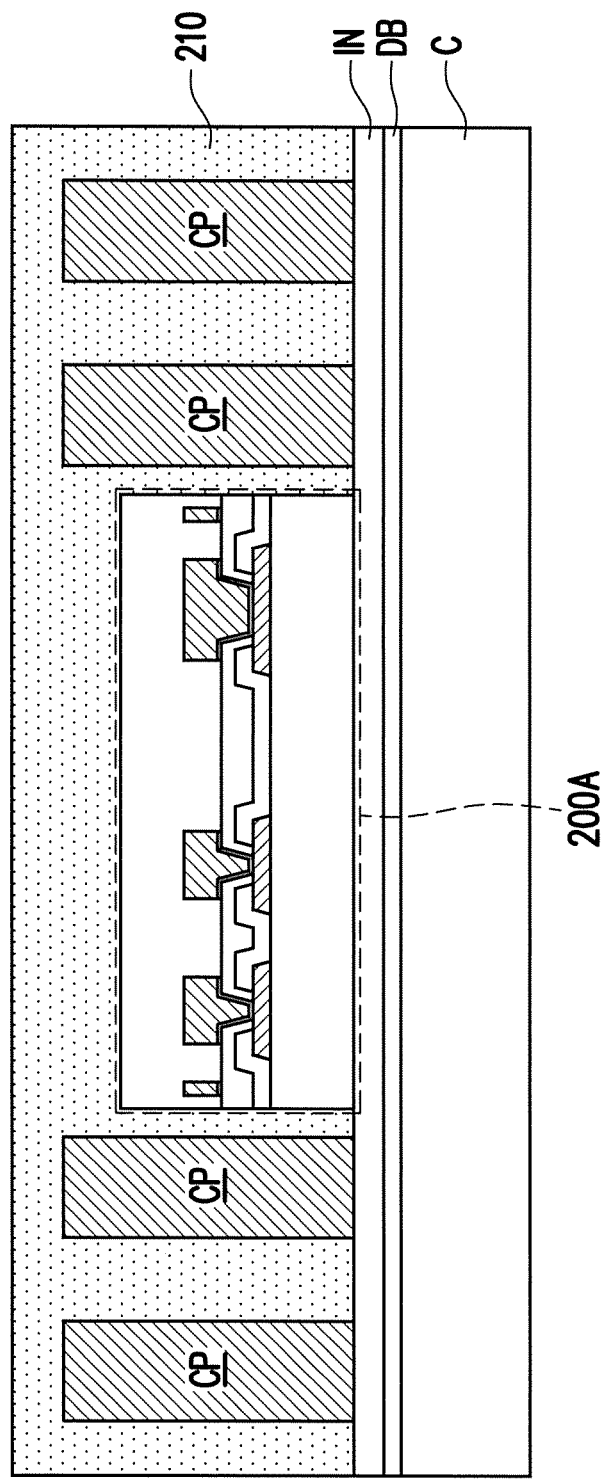

Referring to FIG. 1F, an insulating encapsulation 210 is formed over the carrier C (e.g., on the insulating layer IN) to encapsulate the integrated circuit component 200A and the conductive pillars CP. In other words, the integrated circuit component 200A and the conductive pillars CP are covered by and embedded in the insulating encapsulation 210. In some embodiments, the insulating encapsulation 210 is a molding compound formed by a molding process, and the material of the insulating encapsulation 210 may include epoxy or other suitable resins. For example, the insulating encapsulation 210 may be epoxy resin containing chemical filler.

Figure 1G:
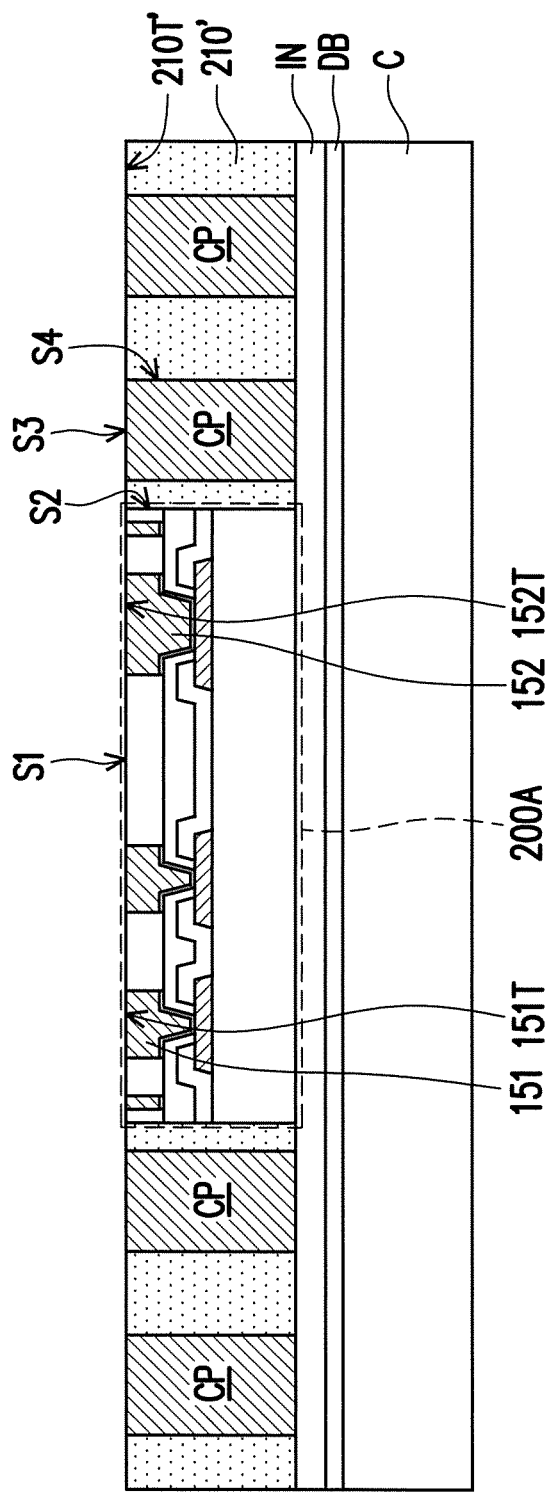

Referring to FIG. 1F and FIG. 1G, in some embodiments, the insulating encapsulation 210, the conductive pillars CP and the integrated circuit component 200A are planarized until a top surface S1 of the integrated circuit component 200A (e.g., the top surfaces 151T of the conductive vias 151, the top surfaces 152T of the conductive vias 152, and/or the top surfaces of the alignment marks AM) and top surfaces S3 of the conductive pillars CP are exposed. After the insulating encapsulation 210 is planarized, a planarized insulating encapsulation 210' is formed over the carrier C (e.g., on the insulating layer IN). During the planarized process of the insulating encapsulation 210 (shown in FIG. 1G), the protection layer 160 is also planarized. In some embodiments, as shown in FIG. 1G, during the planarized process of the insulating encapsulation 210 and the protection layer 160, portions of the conductive pillars CP are planarized also. The planarized insulating encapsulation 210' may be formed by mechanical grinding or chemical mechanical polishing (CMP), for example. After the planarizing process, a cleaning step may be optionally performed, for example to clean and remove the residue generated from the planarizing step. However, the disclosure is not limited thereto, and the planarizing step may be performed through any other suitable method.

In some embodiments, as shown in FIG. 1G, the planarized insulating encapsulation 210' physically contacts a sidewall S2 of the integrated circuit component 200A and sidewalls S4 of the conductive pillars CP. In other words, the integrated circuit component 200A and the conductive pillars CP are mostly embedded in the planarized insulating encapsulation 210' with only the top surface S1 of the integrated circuit component 200A and top surface S3 of the conductive pillars CP being accessibly exposed. In certain embodiments, the top surfaces 151T of the conductive vias 151, the top surfaces 152T of the conductive vias 152, the top surfaces of the alignment marks AM, and the top surfaces S3 of the conductive pillars CP are substantially leveled with a top surface 210T' of the planarized insulating encapsulation 210'. In other words, the top surfaces 151T of the conductive vias 151, the top surfaces 152T of the conductive vias 152, the top surfaces of the alignment marks AM, and the top surfaces S3 of the conductive pillars CP are substantially coplanar with the top surface 210T' of the planarized insulating encapsulation 210'.

Figure 1H:
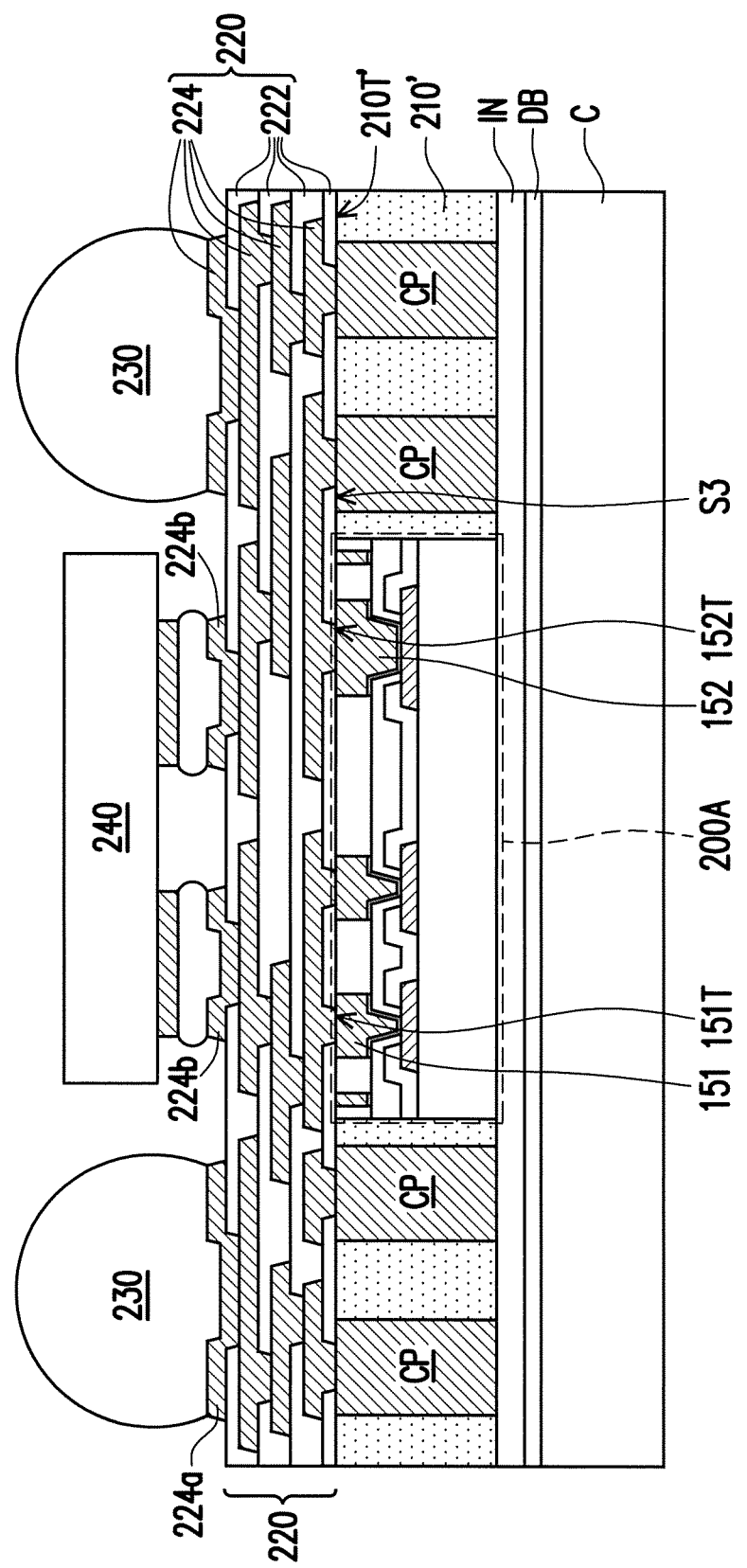

Referring to FIG. 1H, in some embodiments, after the planarized insulating encapsulation 210' is formed, a redistribution circuit structure 220 is formed on the planarized insulating encapsulation 210'. In some embodiments, the redistribution circuit structure 220 is formed on the top surface 210T' of the planarized insulating encapsulation 210', the top surfaces 151T of the conductive vias 151, the top surfaces 152T of the conductive vias 152, the top surfaces of the alignment marks AM, and the top surfaces S3 of the conductive pillars CP. In certain embodiments, the redistribution circuit structure 220 is fabricated to electrically connect with one or more connectors underneath. Here, the afore-said connectors may be the conductive vias 151 and the conductive vias 152 of the integrated circuit component 200A and the conductive pillars CP embedded in the planarized insulating encapsulation 210'. In other words, the redistribution circuit structure 220 is electrically connected to the conductive vias 151, the conductive vias 152, and the conductive pillars CP.

Continued on FIG. 1H, in some embodiments, the redistribution circuit structure 220 includes a plurality of inter-dielectric layers 222 and a plurality of redistribution conductive layers 224 stacked alternately, and the redistribution conductive layers 224 are electrically connected to the conductive vias 151 and the conductive vias 152 of the integrated circuit component 200A and the conductive pillars CP embedded in the planarized insulating encapsulation 210'. As shown in FIG. 1H, in some embodiments, the top surfaces 151T of the conductive vias 151, the top surfaces 152T of the conductive vias 152, and the top surfaces S3 of the conductive pillars CP are in contact with the redistribution circuit structure 220. In such embodiments, the top surfaces 151T of the conductive vias 151, the top surfaces 152T of the conductive vias 152, and the top surfaces S3 of the conductive pillars CP are in contact with the bottommost one of the redistribution conductive layers 224. In some embodiments, the top surfaces 151T of the conductive vias 151, the top surfaces 152T of the conductive vias 152, and the top surfaces S3 of the conductive pillars CP are partially covered by the bottommost inter-dielectric layer 222. In certain embodiments, the topmost redistribution conductive layer 224 may include a plurality of pads. In such embodiments, the above-mentioned pads may include a plurality of under-ball metallurgy (UBM) patterns 224a for ball mount and/or a plurality of connection pads 224b for mounting of passive components. The numbers of the under-ball metallurgy patterns 224a and the number of the connection pads 224b are not limited according to the disclosure. The numbers of the inter-dielectric layers 222 and of the redistribution conductive layers 224 are not limited according to the disclosure.

As shown in FIG. 1H, in some embodiments, after the redistribution circuit structure 220 is formed, a plurality of conductive balls 230 are placed on the under-ball metallurgy patterns 224a, and at least one passive component 240 is mounted on the connection pads 224b. In some embodiments, the conductive balls 230 may be placed on the under-ball metallurgy patterns 224a through ball placement process, and the passive components 240 may be mounted on the connection pads 224b through soldering process. In some embodiments, through the redistribution circuit structure 220 and the conductive pillars CP, some of the conductive balls 230 are electrically connected to the integrated circuit component 200A. In some embodiments, through the redistribution circuit structure 220 and the conductive pillars CP, some of the conductive balls 230 are electrically connected to the conductive balls. In some embodiments, through the redistribution circuit structure 220 and the conductive pillars CP, some of the conductive balls 230 are electrically connected to the passive component 240. In certain embodiments, some of the conductive balls 230 may be electrically floated or grounded, the disclosure is not limited thereto.

Figure 1I:
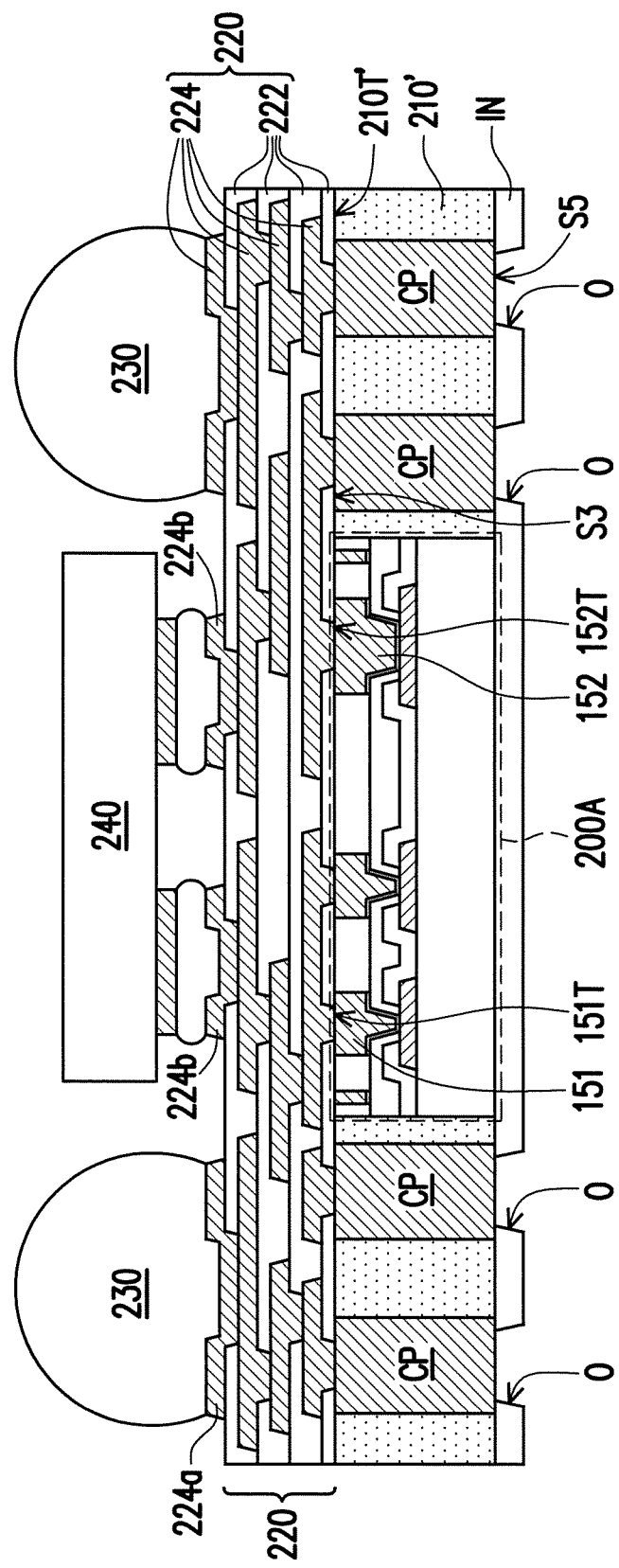

Referring to FIG. 1H and FIG. 1I, in some embodiments, after the redistribution circuit structure 220, the conductive balls 230 and the passive component 240 are formed, the insulating layer IN, the planarized insulating encapsulation 210' and the integrated circuit component 200A are de-bonded from the de-bonding layer DB carried by the carrier C, such that the insulating layer IN is separated from the carrier C. In embodiments where the de-bonding layer DB is the LTHC release layer, an UV laser irradiation may be utilized to facilitate peeling of the insulating layer IN from the carrier C.

As shown in FIG. 1I, in some embodiments, the insulating layer IN may be further patterned, such that a plurality of contact openings O is formed in the insulating layer IN to expose bottom surfaces S5 of the conductive pillars CP. The number of the contact openings O may correspond to the number of the conductive pillars CP, the disclosure is not limited thereto. In some embodiments, the contact openings O in the insulating layer IN are formed by laser drilling process or other suitable processes.

Figure 1J:
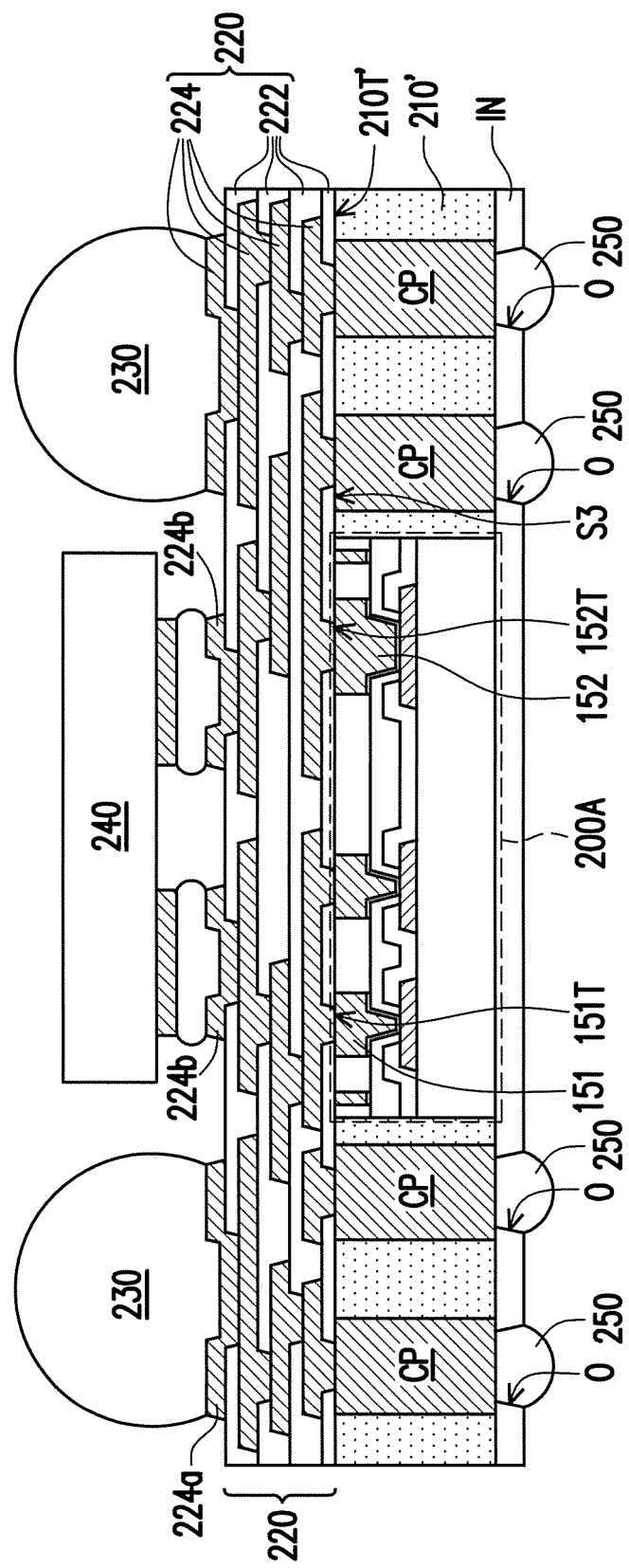

Referring to FIG. 1J, in some embodiments, after the contact openings O are formed in the insulating layer IN, a plurality of conductive balls 250 is respectively formed on the bottom surfaces S5 of the conductive pillars CP that are exposed by the contact openings O. And, the conductive balls 250 may be, for example, reflowed to bond with the bottom surfaces S5 of the conductive pillars CP. As shown in FIG. 1J, after the conductive balls 230 and the conductive balls 250 are formed, formation of an integrated fan-out (InFO) package of the integrated circuit component 200A having dual-side terminals is accomplished. In some embodiments, through the redistribution circuit structure 220 and the conductive pillars CP, some of the conductive balls 250 are electrically connected to the integrated circuit component 200A. In some embodiments, through the redistribution circuit structure 220 and the conductive pillars CP, some of the conductive balls 250 are electrically connected to the conductive balls. In some embodiments, through the redistribution circuit structure 220 and the conductive pillars CP, some of the conductive balls 250 are electrically connected to the passive component 240. In certain embodiments, some of the conductive balls 250 may be electrically floated or grounded, the disclosure is not limited thereto.

In an alternative embodiment, an additional package (not shown) may be provided. In some embodiments, the additional package, for example, may include a memory device. In certain embodiments, the additional package may be stacked over and electrically connected to the integrated circuit component 200A depicted in FIG. 1J through the conductive balls 250, such that a package-on-package (POP) structure is fabricated. However, the disclosure is not limited thereto.

In an alternative embodiment, in FIG. 1E, more than one of the integrated circuit components 200A may be picked-up and placed on the insulating layer IN, and the integrated circuit components 200A removably bonded to the insulating layer IN may be arranged in an array. When the integrated circuit components 200A placed on the insulating layer IN are arranged in an array, the conductive pillars CP may be divided into groups corresponding to the number of the integrated components 200A.

Figure 7:
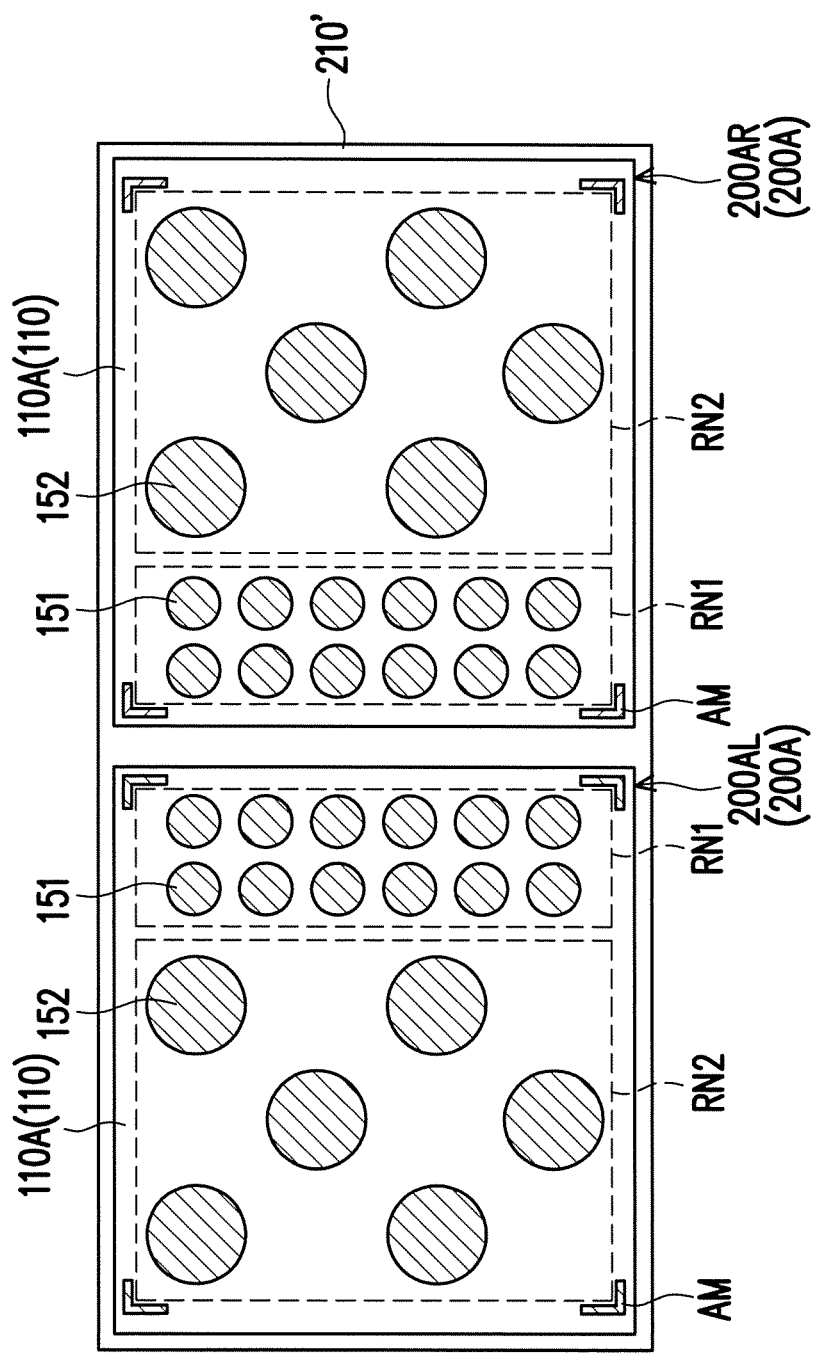
FIG. 7 is an enlarged, schematic top-plane view of integrated circuit components and an insulating encapsulation in accordance with some exemplary embodiments of the disclosure.
Figure 8:
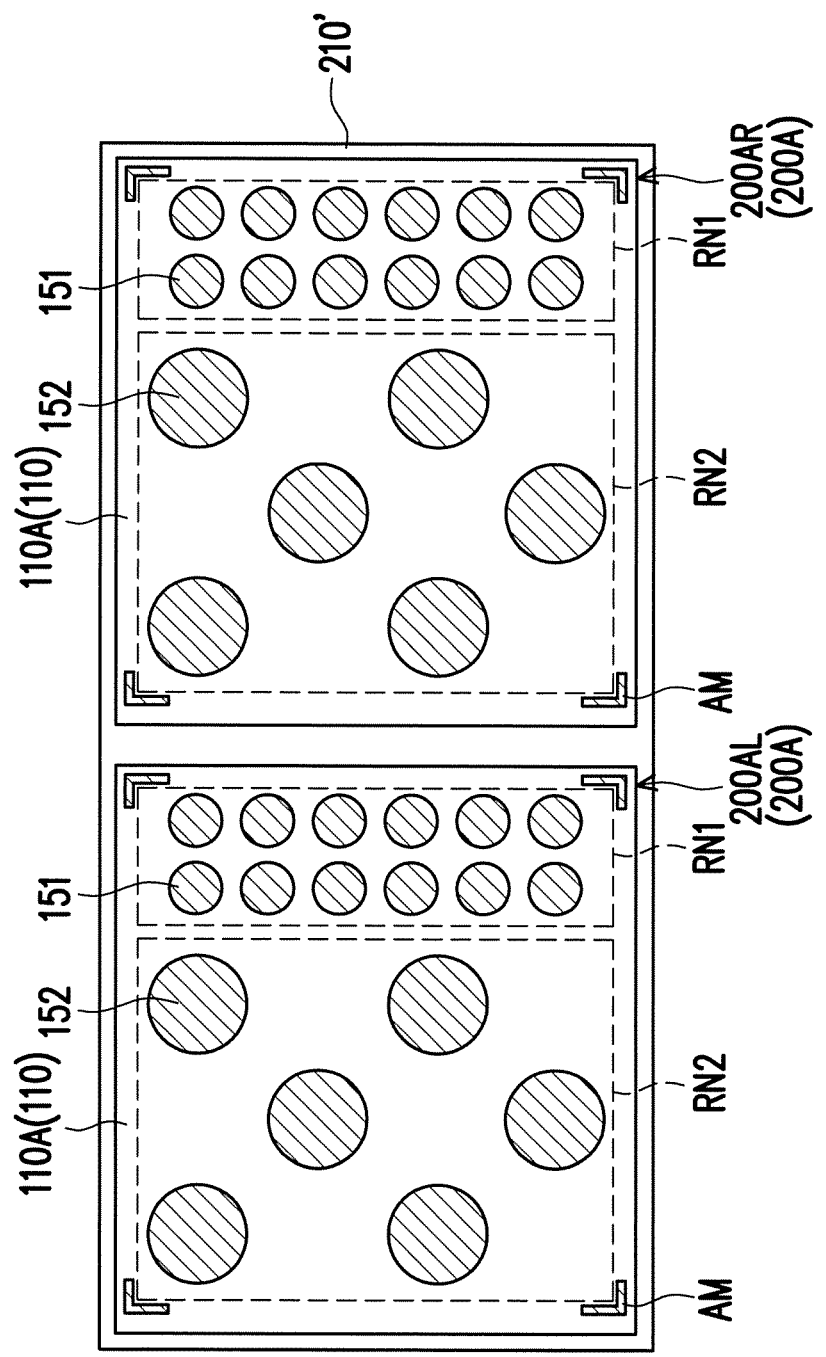
FIG. 8 is an enlarged, schematic top-plane view of integrated circuit components and an insulating encapsulation in accordance with some exemplary embodiments of the disclosure.
Figure 9:
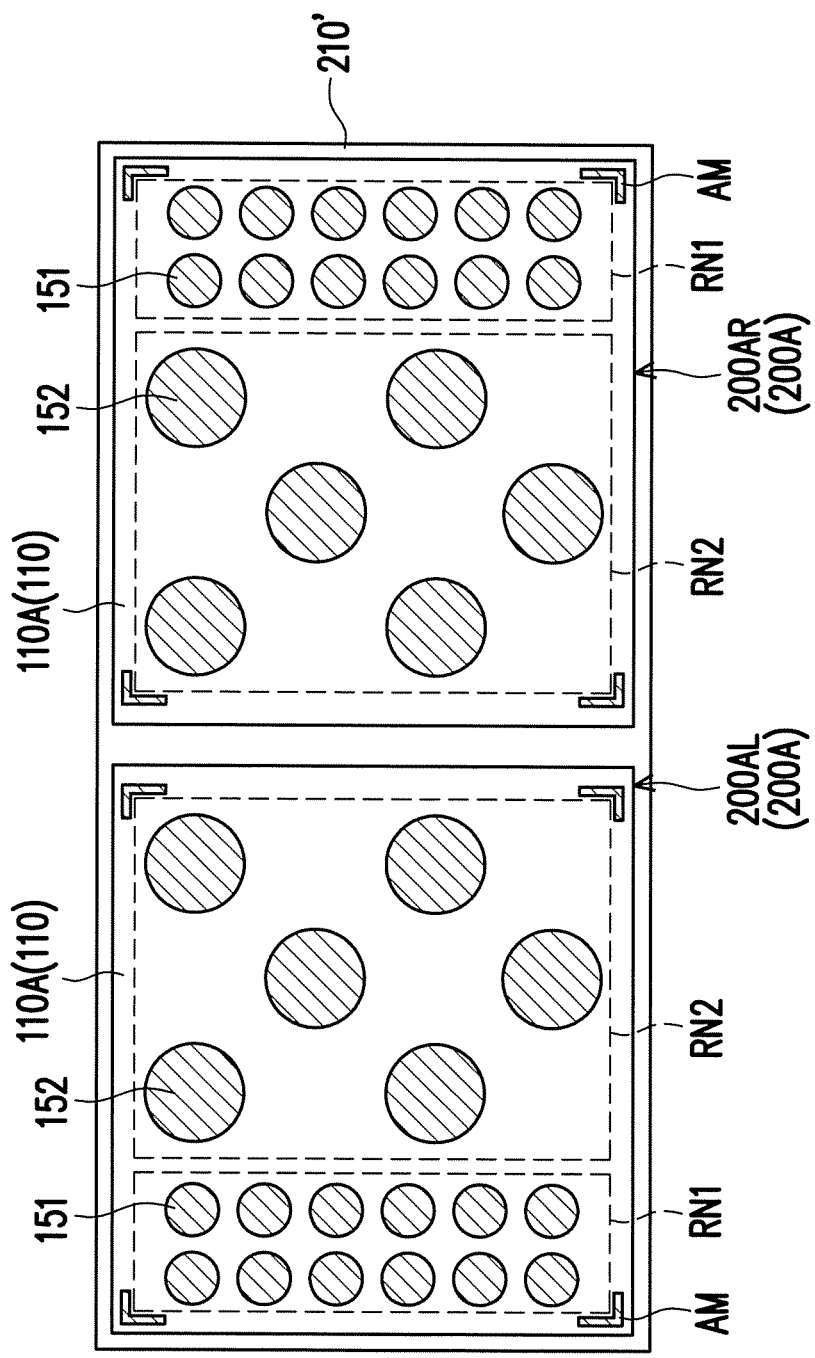
FIG. 9 is an enlarged, schematic top-plane view of integrated circuit components and an insulating encapsulation in accordance with some exemplary embodiments of the disclosure.

FIG. 7 is an enlarged, schematic top-plane view of integrated circuit components and an insulating encapsulation in accordance with some exemplary embodiments of the disclosure. FIG. 8 is an enlarged, schematic top-plane view of integrated circuit components and an insulating encapsulation in accordance with some exemplary embodiments of the disclosure. FIG. 9 is an enlarged, schematic top-plane view of integrated circuit components and an insulating encapsulation in accordance with some exemplary embodiments of the disclosure. Referring to FIG. 1A to FIG. 1J and FIG. 7 to FIG. 9 together, the package structures respectively depicted in FIG. 7 to FIG. 9 are similar to the package structure depicted in FIG. 1A to FIG. 1J, where the difference is that, more than one integrated circuit components 200A are included in the package structures respectively depicted in FIG. 7 to FIG. 9.

In FIG. 7 to FIG. 9, certain structural features including the planarized insulating encapsulation 210' and the integrated circuit components 200A having conductive vias 151, the conductive vias 152, and the active surface 110A of the semiconductor die 110 are stressed for illustration purposes, and only two integrated circuit components 200A are shown in FIG. 7 to FIG. 9 for easy illustration. It should be noted that the number of the integrated circuit components 200A is not limited thereto. Also, certain details or descriptions of the arrangement of the conductive vias 151 and the conductive vias 152 of each of the integrated circuit components 200A will not be repeated herein, for simplicity. In some embodiments, the two integrated circuit components 200A are arranged aside to each other, where one of the two integrated circuit components 200A is referred as an integrated circuit component 200AL, and other one of the two integrated circuit components 200A is referred as an integrated circuit component 200AR.

In some embodiments, as shown in FIG. 7, the region RN1 of the integrated circuit component 200AL and the region RN1 of the integrated circuit component 200AR are located between the region RN2 of the integrated circuit component 200AL and the region RN2 of the integrated circuit component 200AR. For example, the region RN1 of the integrated circuit component 200AL is located between the region RN1 of the integrated circuit component 200AR and the region RN2 of the integrated circuit component 200AL, while the region RN1 of the integrated circuit component 200AR is located between the region RN1 of the integrated circuit component 200AL and the region RN2 of the integrated circuit component 200AR. However, the disclosure is not limited thereto.

In an alternative embodiment, as shown in FIG. 8, the region RN1 of the integrated circuit component 200AL and the region RN2 of the integrated circuit component 200AR are located between the region RN2 of the integrated circuit component 200AL and the region RN1 of the integrated circuit component 200AR. For example, the region RN1 of the integrated circuit component 200AL is located between the region RN2 of the integrated circuit component 200AR and the region RN2 of the integrated circuit component 200AL, while the region RN2 of the integrated circuit component 200AR is located between the region RN1 of the integrated circuit component 200AL and the region RN1 of the integrated circuit component 200AR.

In an alternative embodiment, as shown in FIG. 9, the region RN2 of the integrated circuit component 200AL and the region RN2 of the integrated circuit component 200AR are located between the region RN1 of the integrated circuit component 200AL and the region RN1 of the integrated circuit component 200AR. The region RN2 of the integrated circuit component 200AL is located between the region RN2 of the integrated circuit component 200AR and the region RN1 of the integrated circuit component 200AL, while the region RN2 of the integrated circuit component 200AR is located between the region RN2 of the integrated circuit component 200AL and the region RN1 of the integrated circuit component 200AR.

According to some embodiments, an integrated circuit component including a semiconductor die, a plurality of conductive vias and a protection layer is provided. The semiconductor die includes an active surface and a plurality of conductive pads disposed on the active surface. The conductive vias are respectively disposed on and in contact with the conductive pads, wherein each conductive via of a first group of the conductive vias has a first maximum size, each conductive via of a second group of the conductive vias has a second maximum size, and the first maximum size is less than the second maximum size in a vertical projection on the active surface. The protection layer covers the active surface and is at least in contact with sidewalls of the conductive vias.

According to some embodiments, an integrated circuit component including a semiconductor die, a plurality of conductive vias and a protection layer is provided. The semiconductor die includes an active surface and a plurality of conductive pads disposed on the active surface, wherein the active surface has a first region and a second region. The conductive vias are respectively disposed on and in contact with the conductive pads, wherein a first group of the conductive vias are arranged in the first region of the active surface, and a second group of the conductive vias are arranged in the second region of the active surface, wherein each conductive via of the first group of the conductive vias has a first maximum size, each conductive via of the second group of the conductive vias has a second maximum size, and the first maximum size is less than the second maximum size in a vertical projection on the active surface. The protection layer covers the active surface and is at least in contact with sidewalls of the conductive vias.

According to some embodiments, an integrated circuit component including a semiconductor die, a plurality of conductive vias and a protection layer is provided. The semiconductor die includes an active surface and a plurality of conductive pads disposed on the active surface. The conductive vias are respectively disposed on and in contact with the conductive pads, wherein a first group of the conductive vias and a second group of the conductive vias are arranged in a form of an array along a first direction and a second direction perpendicular to the first direction on the active surface, the first group of the conductive vias and the second group of the conductive vias are alternately arranged along the first direction, and the first group of the conductive vias and the second group of the conductive vias are alternately arranged along the second direction, and wherein each conductive via of the first group of the conductive vias has a first maximum size, each conductive via of the second group of the conductive vias has a second maximum size, and the first maximum size is less than the second maximum size in a vertical projection on the active surface. The protection layer covers the active surface and is at least in contact with sidewalls of the conductive vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
 an integrated circuit component, comprising:
  a semiconductor die, having an active surface and conductive pads disposed on the active surface;

conductive vias, respectively disposed on and in contact with the conductive pads, wherein each conductive via of a first group of the conductive vias has a first maximum size, each conductive via of a second group of the conductive vias has a second maximum size, and the first maximum size is less than the second maximum size in a vertical projection on the active surface, wherein the first group of the conductive vias are arranged into a first array, the second group of the conductive vias are arranged into a second array, and the first array and the second array are located on the active surface side-by-side, wherein the first array is located at only one side of the second array;

alignment marks, disposed on and electrically isolated from the semiconductor die, wherein a thickness of each of the alignment marks is less than a thickness of each of the conductive vias along a stacking direction of the conductive vias and the semiconductor die; and a protection layer, covering the active surface and at least in contact with sidewalls of the conductive vias and sidewalls of the alignment marks wherein top surfaces of the alignment marks, top surfaces of the first group of the conductive vias and top surfaces of the second group of the conductive vias are substantially coplanar to a top surface of the protection layer;

an insulating encapsulation, encapsulating a sidewall of the integrated circuit component;

conductive pillars, arranged aside of the integrated circuit component, wherein sidewalls of each of the conductive pillars are covered by the insulating encapsulation; and a redistribution circuit structure, disposed on and electrically connected to the integrated circuit component, wherein the redistribution circuit structure is electrically connected to the conductive vias and is electrically isolated from the alignment marks.

2. The package structure of claim 1, wherein a ratio of the first maximum size to the second maximum size is about 0.1 to about 0.75.

3. The package structure of claim 1, wherein the integrated circuit component further comprises:

a first group of contacting pads each being located between a corresponding one of the conductive pads and a respective one of the first group of the conductive vias, respectively; and a second group of contacting pads each being located between a corresponding one of the conductive pads and a respective one of the second group of the conductive vias, respectively, wherein each contacting pad of the first group of the contacting pads has a third maximum size, each contacting pad of the second group of the contacting pads has a fourth maximum size, and the third maximum size is less than the fourth maximum size in the vertical projection on the active surface.

4. The package structure of claim 3, wherein a ratio of the third maximum size to the fourth maximum size is about 0.1 to about 0.75.

5. The package structure of claim 1, wherein the integrated circuit component further comprises:

at least one dummy via, disposed on the active surface, wherein the at least one dummy via is separated apart from the conductive vias, and a sidewall of the at least one dummy via is covered by the protection layer.

6. The package structure of claim 1, wherein the redistribution circuit structure is disposed on the insulating encapsulation and the conductive pillars and is electrically connected to the conductive pillars.

7. A package structure, comprising:

an integrated circuit component, comprising:

a semiconductor die, having an active surface and conductive pads disposed on the active surface, wherein the active surface has a first region and a second region;

conductive vias, respectively disposed on and in contact with the conductive pads, wherein a first group of the conductive vias are arranged in the first region of the active surface, and a second group of the conductive vias are arranged in the second region of the active surface, wherein each conductive via of the first group of the conductive vias has a first maximum size, each conductive via of the second group of the conductive vias has a second maximum size, and the first maximum size is less than the second maximum size in a vertical projection on the active surface;

alignment marks, disposed on and electrically isolated from the semiconductor die, wherein a thickness of each of the alignment marks is less than a thickness of each of the conductive vias along a stacking direction of the conductive vias and the semiconductor die; and a protection layer, covering the active surface and at least in contact with sidewalls of the conductive vias and sidewalls of the alignment marks, wherein a surface of the protection layer, surfaces of the conductive vias and surfaces of the alignment marks are coplanar with each other;

an insulating encapsulation, encapsulating a sidewall of the integrated circuit component;

conductive pillars, arranged aside of the integrated circuit component, wherein sidewalls of each of the conductive pillars are covered by the insulating encapsulation; and a redistribution circuit structure, disposed on and electrically connected to the integrated circuit component, wherein the redistribution circuit structure is electrically connected to the conductive vias and is electrically isolated from the alignment marks.

8. The package structure of claim 7, wherein the first group of the conductive vias are arranged in a form of an array along a first direction and a second direction perpendicular to the first direction in the first region of the active surface, a first distance exists between two immediately adjacent conductive vias of the first group of the conductive vias arranged along the first direction, and a second distance exists between two immediately adjacent conductive vias of the first group of the conductive vias arranged along the second direction, and wherein the second group of the conductive vias are arranged into parallel lines along a third direction in the second region of the active surface, a third distance exists between two immediately adjacent conductive vias of the second group of the conductive vias arranged along the first direction, and a fourth distance exists between two immediately adjacent conductive vias of the second group of the conductive vias arranged along the second direction, wherein the third direction is different from the first direction and the second direction.

9. The package structure of claim 8, wherein the first distance is substantially equal to the second distance, and the third distance is substantially equal to the fourth distance.

10. The package structure of claim 8, wherein the first distance is different from the second distance, and the third distance is substantially equal to the fourth distance.

11. The package structure of claim 7, wherein the integrated circuit component further comprises:
dummy vias disposed on the active surface and arranged in the second region of the active surface, wherein a gap exists between one of the dummy vias and one conductive via of the second group of the conductive vias immediately adjacent thereto, and sidewalls of the dummy vias are covered by the protection layer.

12. The package structure of claim 7, wherein the surface of the protection layer, the surfaces of the conductive vias, and the surfaces of the alignment marks are coplanar to a surface of the insulating encapsulation.

13. The package structure of claim 7, wherein the redistribution circuit structure is disposed on the insulating encapsulation and the conductive pillars and is electrically connected to the conductive pillars, and
wherein in a plane view of the semiconductor die, the first region has a first width along a row direction and a first length along a column direction, the second region has a second width along the row direction and a second length along the column direction, wherein the first width is less than the first length, the second width is less than the second length, and the first region and the second region are arranged in a form of side-by side along the row direction, wherein the first region is located at only one side of the second region along the row direction.

14. A package structure, comprising:
a semiconductor die, having an active surface and conductive pads disposed on the active surface;
conductive vias, respectively disposed on and in contact with the conductive pads, wherein a first group of the conductive vias and a second group of the conductive vias are respectively arranged into a first array and a second array along a first direction and a second direction perpendicular to the first direction, and wherein each conductive via of the first group of the conductive vias has a first maximum size, each conductive via of the second group of the conductive vias has a second maximum size, and the first maximum size is less than the second maximum size in a vertical projection on the active surface;
alignment marks, disposed on and electrically isolated from the semiconductor die, wherein a thickness of each of the alignment marks is less than a thickness of each of the conductive vias along a stacking direction of the conductive vias and the semiconductor die;
conductive pillars, arranged aside of the semiconductor die;
an insulating encapsulation, encapsulating the semiconductor die and the conductive pillars, wherein a surface of the insulating encapsulation, surfaces of the conductive vias and surfaces of the alignment marks are planar and coplanar with each other; and
a redistribution circuit structure, disposed on the insulating encapsulation, wherein the redistribution circuit structure is electrically connected to the semiconductor die and the conductive pillars and is electrically isolated from the alignment marks.

15. The package structure of claim 14, wherein a first size of the first array along the first direction is less than a second size of the first array along the second direction, and a first size of the second array along the first direction is less than a second size of the second array along the second direction, wherein the first array and the second array are arranged on the active surface side-by-side along the first direction, wherein the first array is located at only one side of the second array along the first direction.

16. The package structure of claim 14, wherein a ratio of the first maximum size to the second maximum size is about 0.1 to about 0.75.

17. The package structure of claim 1, further comprising:
an additional integrated circuit component, located next to the integrated circuit component, encapsulated in the insulating encapsulation and electrically connected to the redistribution circuit structure, wherein the additional integrated circuit component comprises:
a second semiconductor die, having a second active surface and second conductive pads disposed on the second active surface; and
second conductive vias, respectively disposed on and in contact with the second conductive pads, wherein each second conductive via of a first group of the second conductive vias has a fifth maximum size, each second conductive via of a second group of the second conductive vias has a sixth maximum size, and the fifth maximum size is less than the sixth maximum size in a vertical projection on the second active surface, wherein the first group of the second conductive vias are arranged into a third array, the second group of the second conductive vias are arranged into a fourth array, and the third array and the fourth array are located on the second active surface side-by-side,
wherein in a top view of the package structure, the first array, the second array, the third array and the fourth array are arranged side-by-side along a direction, the first array is located between the second array and the third array, and the third array is located between the first array and the fourth array.

18. The package structure of claim 7, further comprising:
an additional integrated circuit component, located next to the integrated circuit component, encapsulated in the insulating encapsulation and electrically connected to the redistribution circuit structure, wherein the additional integrated circuit component comprises:
a second semiconductor die, having a second active surface and second conductive pads disposed on the second active surface, wherein the second active surface has a third region and a fourth region, and the third region and the fourth region are arranged in a form of side-by side; and
second conductive vias, respectively disposed on and in contact with the second conductive pads, wherein a first group of the second conductive vias are arranged in the third region of the second active surface, and a second group of the second conductive vias are arranged in the fourth region of the second active surface, wherein each second conductive via of the first group of the second conductive vias has a fifth maximum size, each second conductive via of the second group of the second conductive vias has a sixth maximum size, and the fifth maximum size is less than the sixth maximum size in a vertical projection on the second active surface,
wherein in a top view of the package structure, the first region, the second region, the third region and the fourth region are arranged side-by-side along a direction, the first region is located between the second region and the third region, and the third region is located between the first region and the fourth region.

19. The package structure of claim 14, further comprising:
a second semiconductor die, having a second active surface and second conductive pads disposed on the second active surface, wherein the second semiconductor die is encapsulated in the insulating encapsulation and located next to the semiconductor die and the conductive pillars; and
second conductive vias, respectively disposed on and in contact with the second conductive pads, wherein a first group of the second conductive vias are arranged in a third array along the first direction and the second direction, a second group of the second conductive vias are arranged in a fourth array along the first direction and the second direction, and the third array and the fourth array are arranged on the second active surface side-by-side, and wherein each second conductive via of the first group of the second conductive vias has a fifth maximum size, each second conductive via of the second group of the second conductive vias has a sixth maximum size, and the fifth maximum size is less than the sixth maximum size in a vertical projection on the second active surface,
wherein in a top view of the package structure, the first array, the second array, the third array and the fourth array are arranged side-by-side along a direction, the first array is located between the second array and the third array, and the third array is located between the first array and the fourth array.

20. The package structure of claim 1, further comprising:
a passive component, disposed on and electrically coupled to the redistribution circuit structure, wherein the redistribution circuit structure is located between the passive component and the integrated circuit component.

* * * * *